United States Patent
Wang et al.

(10) Patent No.: US 11,948,936 B2
(45) Date of Patent: Apr. 2, 2024

(54) FORMING ESD DEVICES USING MULTI-GATE COMPATIBLE PROCESSESS

(71) Applicant: Taiwan Semiconductor Manufacturing Co., Ltd., Hsin-Chu (TW)

(72) Inventors: Chih-Hung Wang, Hsinchu (TW); Chih Chieh Yeh, Taipei (TW); Zi-Ang Su, Taoyuan County (TW); Chia-Ju Chou, Taipei (TW); Ming-Shuan Li, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/305,556

(22) Filed: Apr. 24, 2023

(65) Prior Publication Data

US 2023/0268337 A1    Aug. 24, 2023

Related U.S. Application Data

(63) Continuation of application No. 17/224,671, filed on Apr. 7, 2021, now Pat. No. 11,637,099.
(Continued)

(51) Int. Cl.
*H01L 27/02*       (2006.01)
*H01L 21/8234*    (2006.01)
(Continued)

(52) U.S. Cl.
CPC .. *H01L 27/0266* (2013.01); *H01L 21/823412* (2013.01); *H01L 21/823431* (2013.01);
(Continued)

(58) Field of Classification Search
CPC ..... H01L 21/823412; H01L 21/823431; H01L 21/823437; H01L 21/823462;
(Continued)

(56) References Cited

U.S. PATENT DOCUMENTS 8,772,109 B2    7/2014 Colinge
8,785,285 B2    7/2014 Tsai et al.
(Continued)

FOREIGN PATENT DOCUMENTS

KR    101454537 B1    10/2014
KR    20160006466 A    1/2016
(Continued)

OTHER PUBLICATIONS

Korean Intellectual Property Office, Korea Notice of Allowance dated Nov. 21, 2022, for Application No. 10-2021-0071656, 8 pages.

*Primary Examiner* — Cheung Lee
(74) *Attorney, Agent, or Firm* — HAYNES AND BOONE, LLP

(57) ABSTRACT

The present disclosure provides a semiconductor device. The semiconductor device includes a fin disposed in a first region of the semiconductor device, channel members disposed in a second region of the semiconductor device and stacked in a vertical direction, first and second metal gates disposed on a top surface of the fin, a third metal gate wrapping around each of the channel members, a first implant region in the fin with a first conductivity type, and a second implant region in the fin with a second conductivity opposite the first conductivity type. The fin includes first and second type epitaxial layers alternatingly disposed in the vertical direction. The first and second type epitaxial layers (Continued)

have different material compositions. The first type epitaxial layers and the channel members have the same material composition.

20 Claims, 25 Drawing Sheets

Related U.S. Application Data

(60) Provisional application No. 63/039,293, filed on Jun. 15, 2020.

(51) Int. Cl.
*H01L 29/423* (2006.01)
*H01L 29/66* (2006.01)
*H01L 29/786* (2006.01)

(52) U.S. Cl.
CPC .. *H01L 21/823437* (2013.01); *H01L 27/0296* (2013.01); *H01L 29/42392* (2013.01); *H01L 29/66545* (2013.01); *H01L 29/66795* (2013.01); *H01L 29/78696* (2013.01)

(58) Field of Classification Search
CPC ..... H01L 21/823475; H01L 21/823821; H01L 21/823871; H01L 23/60; H01L 27/0255; H01L 27/0266; H01L 27/0296; H01L 27/0629; H01L 29/42392; H01L 29/66545; H01L 29/66795; H01L 29/785; H01L 29/78696
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,431,388 B1 | 8/2016 | Gauthier et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Loctefeld et al. |
| 2018/0102359 A1 | 4/2018 | Cheng et al. |
| 2019/0027470 A1 | 1/2019 | Han et al. |
| 2020/0403007 A1 | 12/2020 | Thomson et al. |
| 2021/0183850 A1 | 6/2021 | Nidhi et al. |

FOREIGN PATENT DOCUMENTS

| | | |
|---|---|---|
| KR | 20180138104 A | 12/2018 |
| KR | 20190036521 A | 4/2019 |
| TW | 201503377 A | 1/2015 |
| TW | 201730938 A | 9/2017 |
| TW | 201830651 A | 8/2018 |
| TW | 202013531 A | 4/2020 |

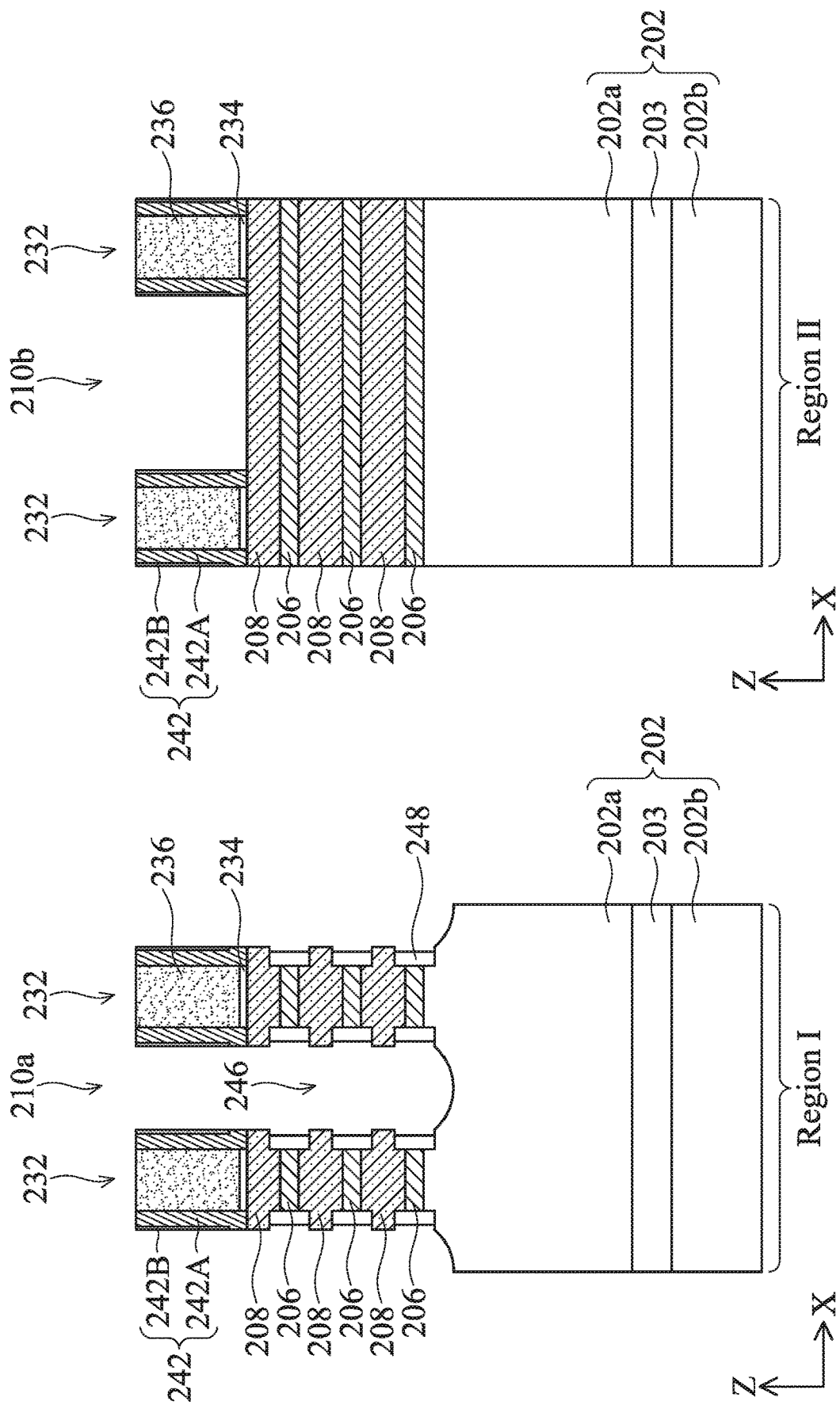

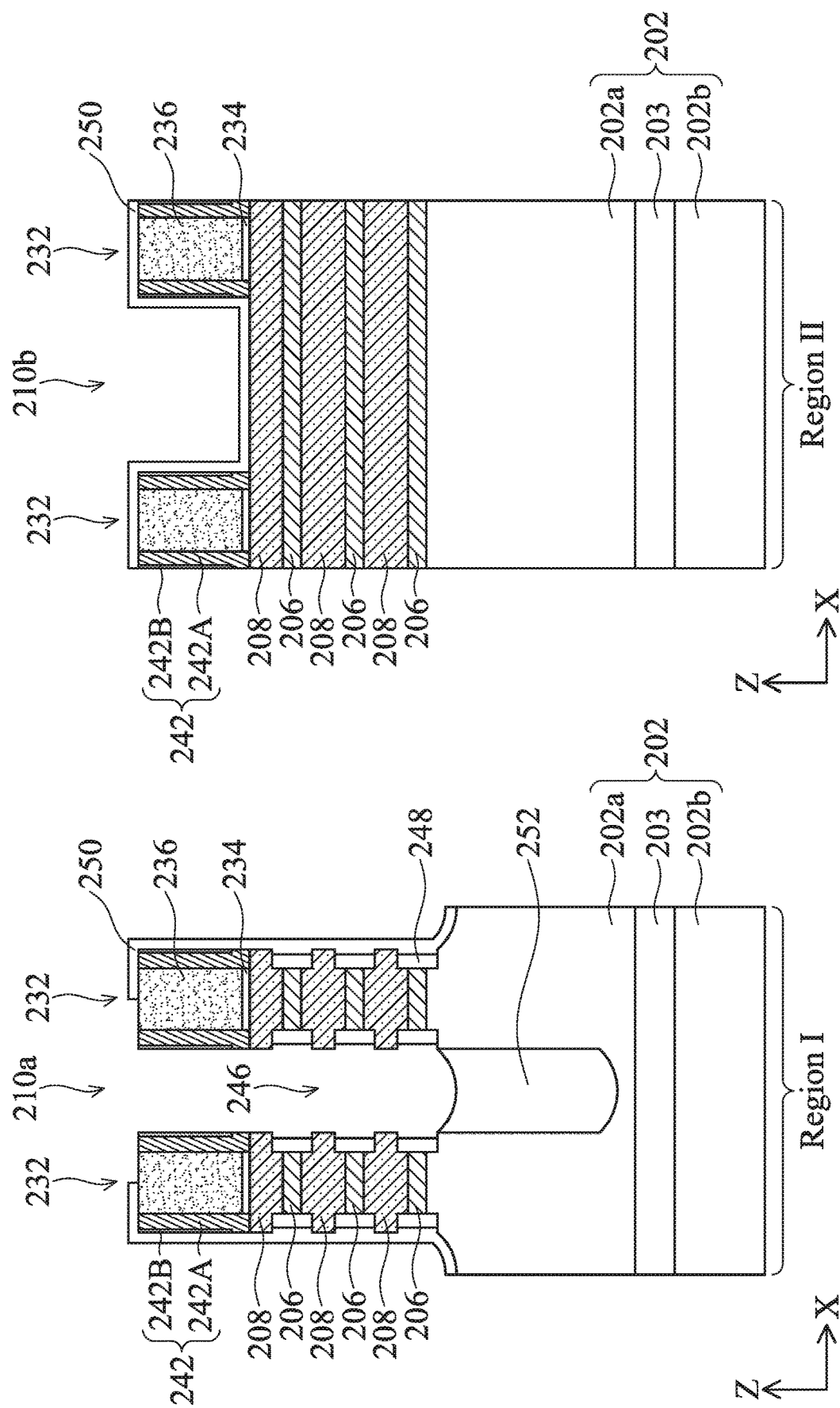

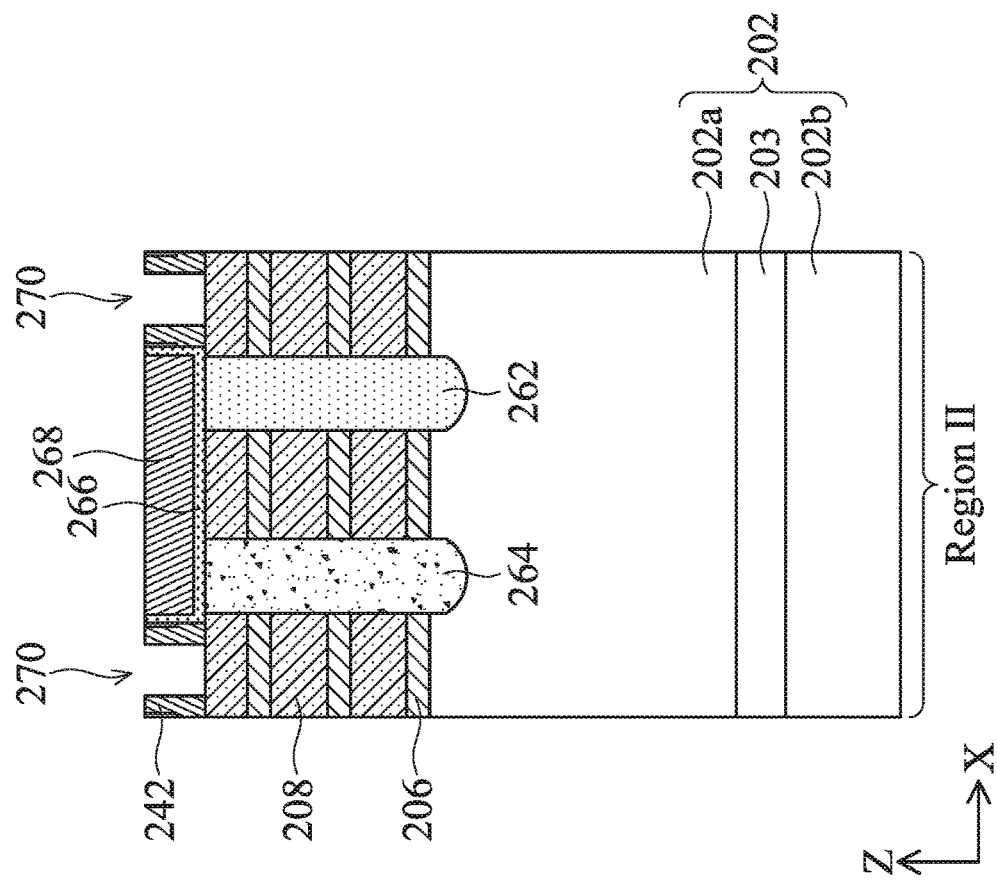
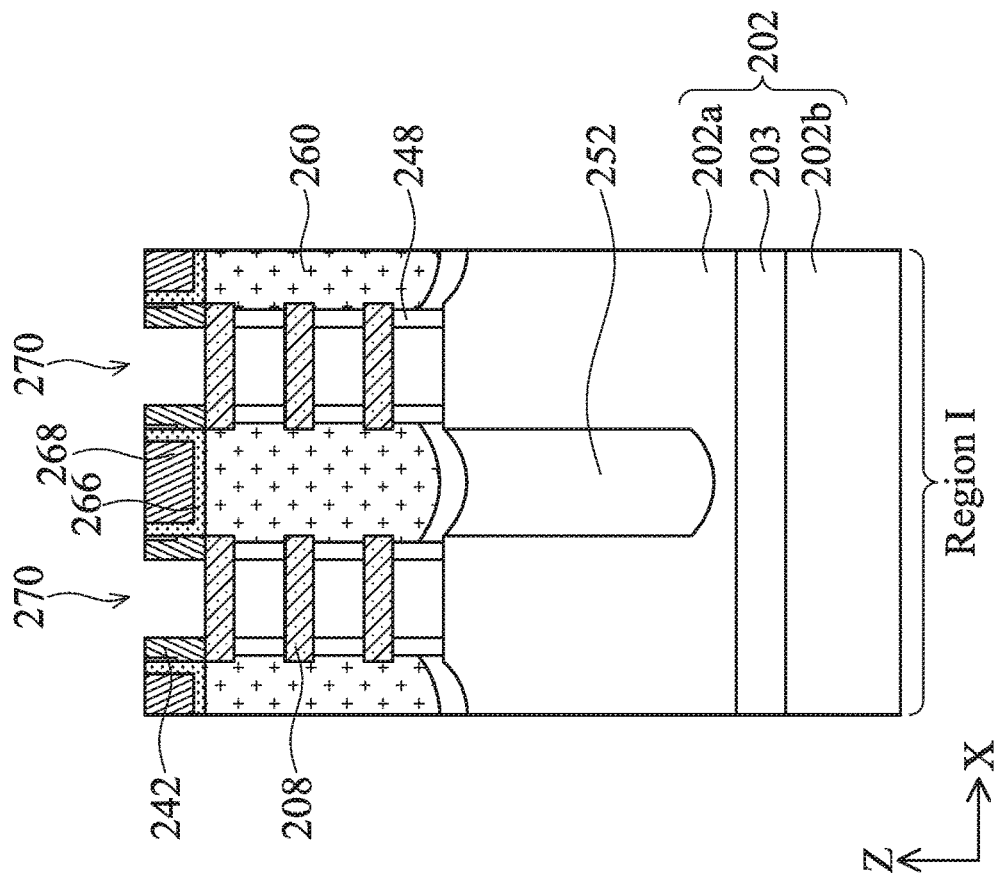
FIG. 13A
FIG. 13B

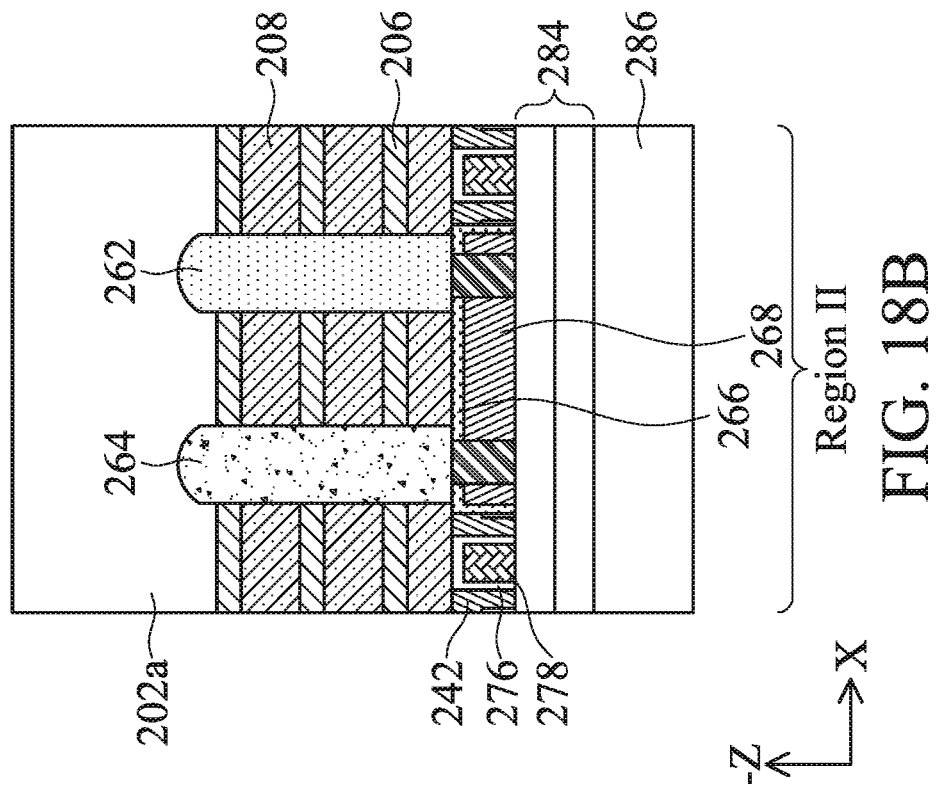
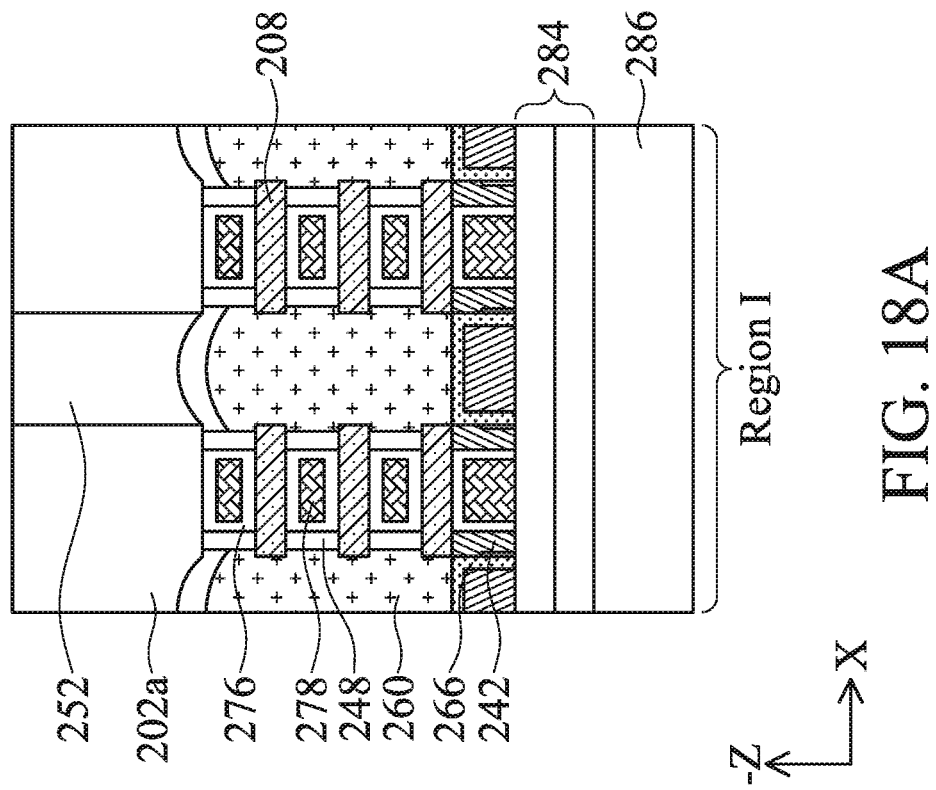
FIG. 18A
FIG. 18B

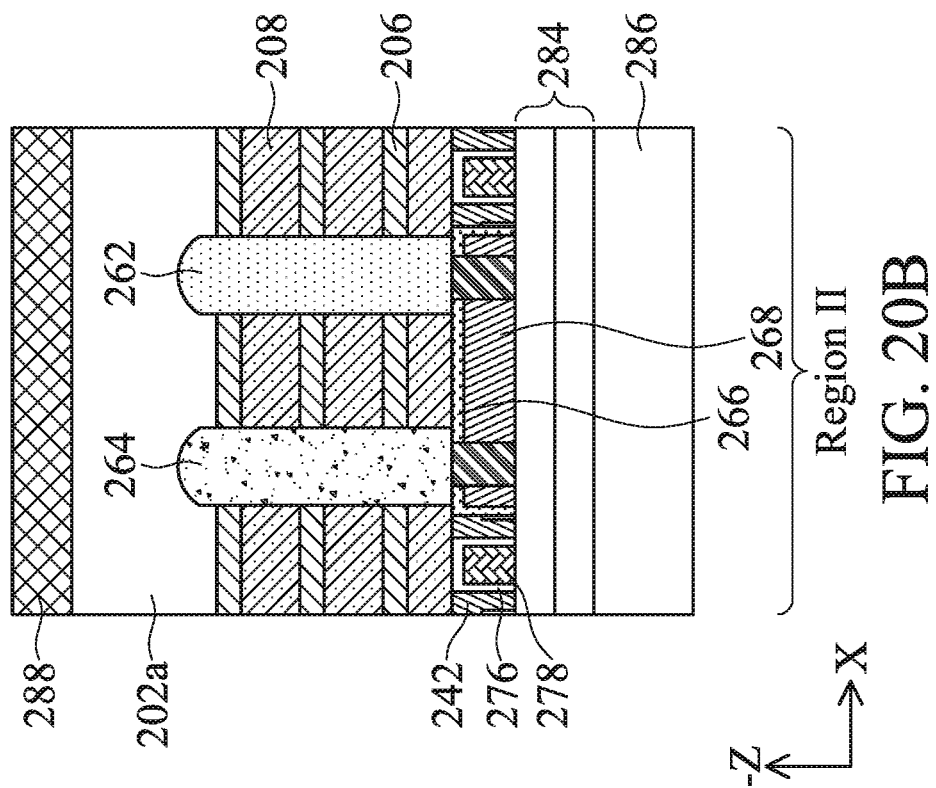
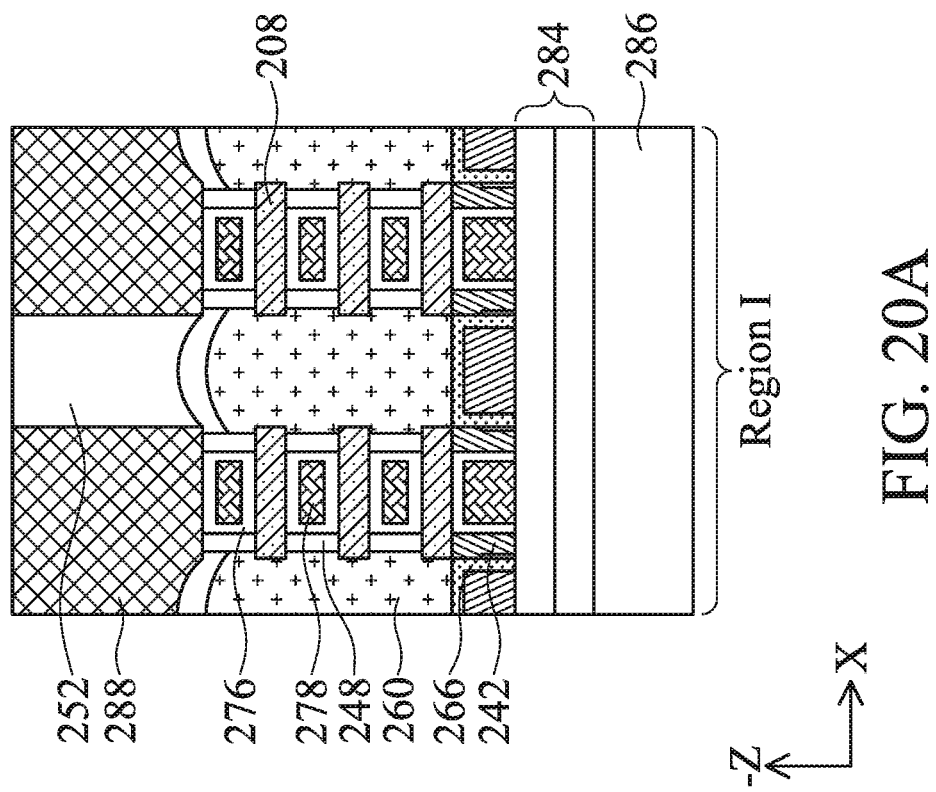

FORMING ESD DEVICES USING MULTI-GATE COMPATIBLE PROCESSESS

PRIORITY

This is a continuation application of U.S. patent application Ser. No. 17/224,671, filed Apr. 7, 2021, which claims the benefits to U.S. Provisional Application Ser. No. 63/039,293 filed Jun. 15, 2020, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structure which can extend around the channel region providing access to the stacked semiconductor channel layers on four sides. Compared to planar transistors, such configuration provides better control of the channel and drastically reduces SCEs (in particular, by reducing sub-threshold leakage).

An IC includes semiconductor devices that serve different functions, such as core functions and electrostatic discharging (ESD) functions. These different functions require semiconductor devices to have different constructions. At the same time, it is advantageous to have similar processes and similar process windows to fabricate these different semiconductor devices to reduce cost and improve yield. Although existing multi-gate (e.g., GAA) transistors and processes are generally adequate for their intended purposes, they have not been entirely satisfactory in every aspect. For example, in the course of IC evolution, backside power rails in addition to frontside interconnects have been introduced to increase the number of metal tracks available for greater power driving capability and simplified metal routing. How to form ESD devices (e.g., ESD diodes) compatible with multi-gate processes that also support backside power rail formation is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 7A, 8A, 9A, 10A, 11A, 12A, 13A, 14A, 15A, 17A, 18A, 19A, 20A, 21A, 22A, and 23A illustrate cross-sectional views along the A-A line of a portion of the semiconductor device in FIG. 5A during fabrication processes according to the method of FIGS. 1A-1C, in accordance with some embodiments of the present disclosure.

FIGS. 6B, 7B, 8B, 9B, 10B, 11B, 12B, 13B, 14B, 15B, 17B, 18B, 19B, 20B, 21B, 22B, and 23B illustrate cross-sectional views along the B-B line of a portion of the semiconductor device in FIG. 5A during fabrication processes according to the method of FIGS. 1A-1C, in accordance with some embodiments of the present disclosure.

DETAILED DESCRIPTION

Figure 1A:
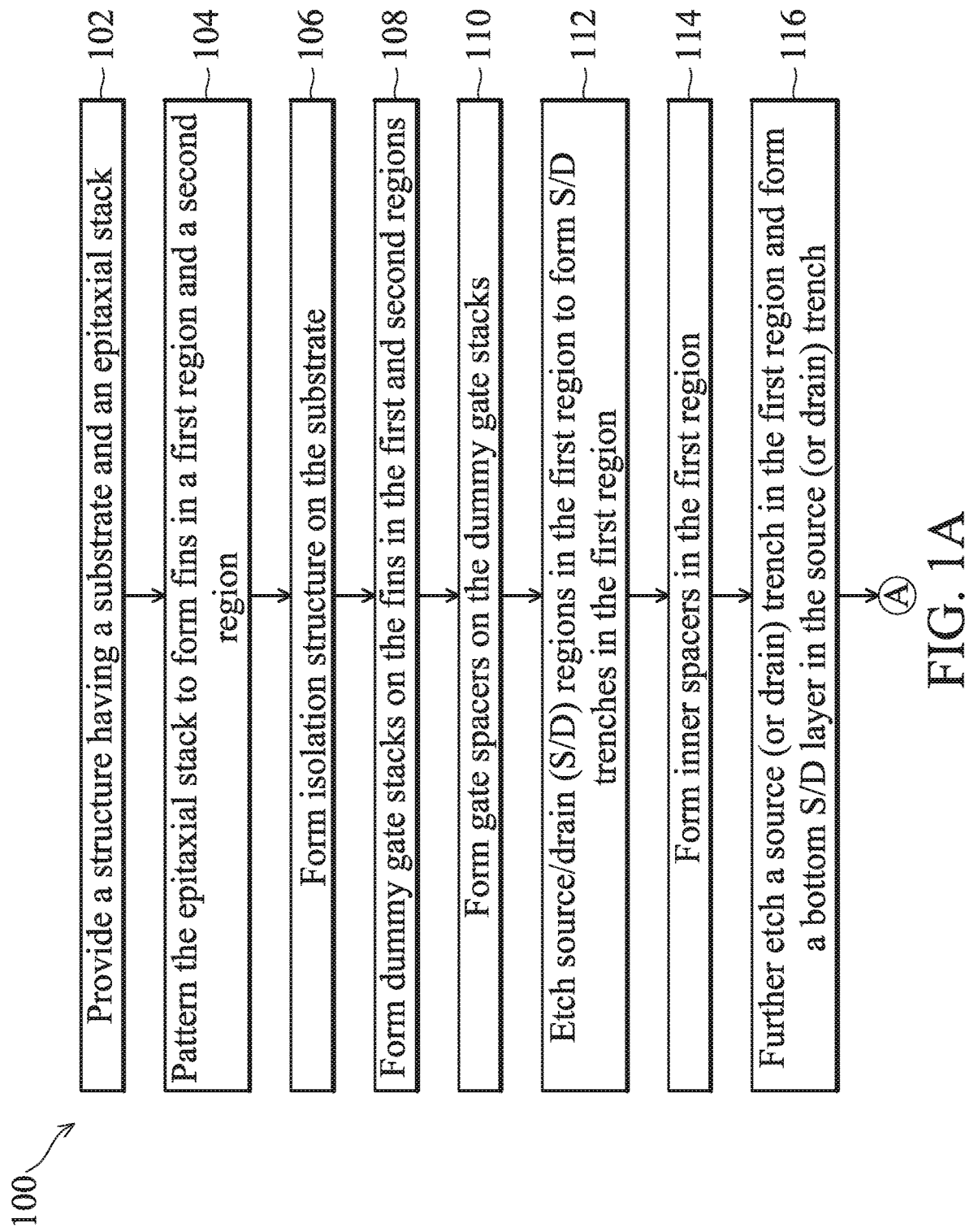
FIGS. 1A, 1B, and 1C show a flow chart of a method of forming a semiconductor structure with ESD devices and backside power rails, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to an electrostatic discharge (ESD) protection device and methods of fabrication thereof that is compatible with multi-gate transistor process flow.

It is well known that extremely high voltages can develop in the vicinity of an integrated circuit (IC) due to the build-up of static charges. A high potential may be generated to an input or output buffer of the integrated circuit, which may be caused by a person touching a package pin that is in electrical contact with the input or output buffer. When the electrostatic charges are discharged, a high current is produced at the package nodes of the integrated circuit, and is referred to electrostatic discharge (ESD). ESD is a serious problem for semiconductor devices since it has the potential of destroying the entire integrated circuit. The duration of the ESD transient is very short, typically in the order of nanoseconds, and the conventional circuit breakers cannot react quickly enough to provide adequate protection. For this reason, it has become a known practice to incorporate ESD devices in ICs. In various embodiments, an IC may have multi-gate transistors (e.g., gate-all-around (GAA) transistors and/or FinFET transistors) placed in a core region providing core functions (e.g., logic and memory applications) and ESD devices placed in an ESD region providing ESD protection.

Yet a recent trend in IC evolution includes providing power rails (or power routings) on a back side (or backside) of a structure containing transistors in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. This approach, unfortunately, faces design and process issues. Particularly, a backside thinning process in removing bulk semiconductor substrate substantially eliminates current path for ESD devices comprising multiple fin elements. Accordingly, what is needed in the art is an ESD protection device whose formation process is compatible with the formation of multi-gate process flow while at the same time overcoming the deficiencies of the prior art.

The details of the structure and fabrication methods of the present disclosure are described below in conjunction with the accompanied drawings, which illustrate a process of making a GAA device in a core region and an ESD device in an ESD region, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

Figure 1B:
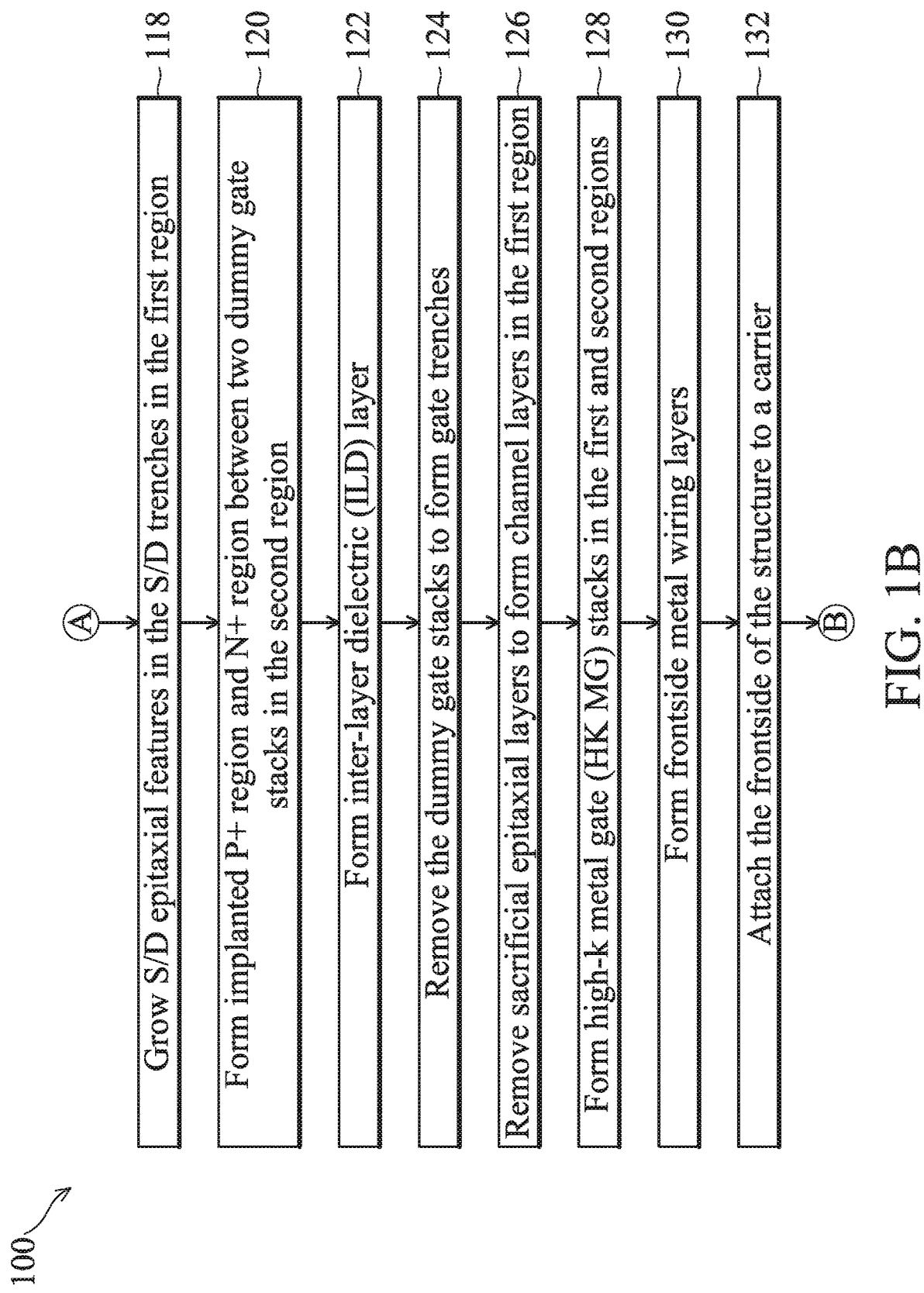
Figure 1C:
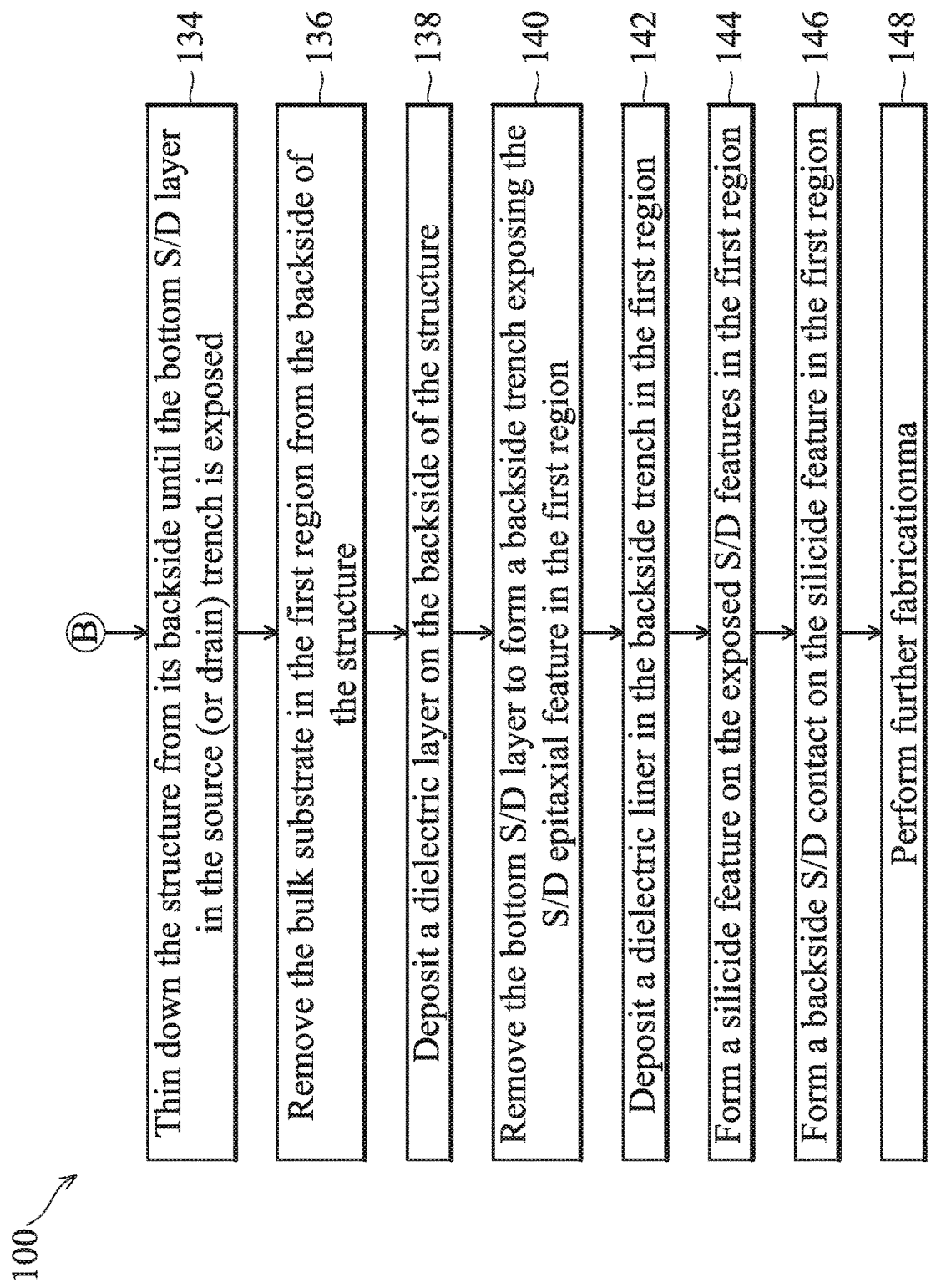
Figure 2:
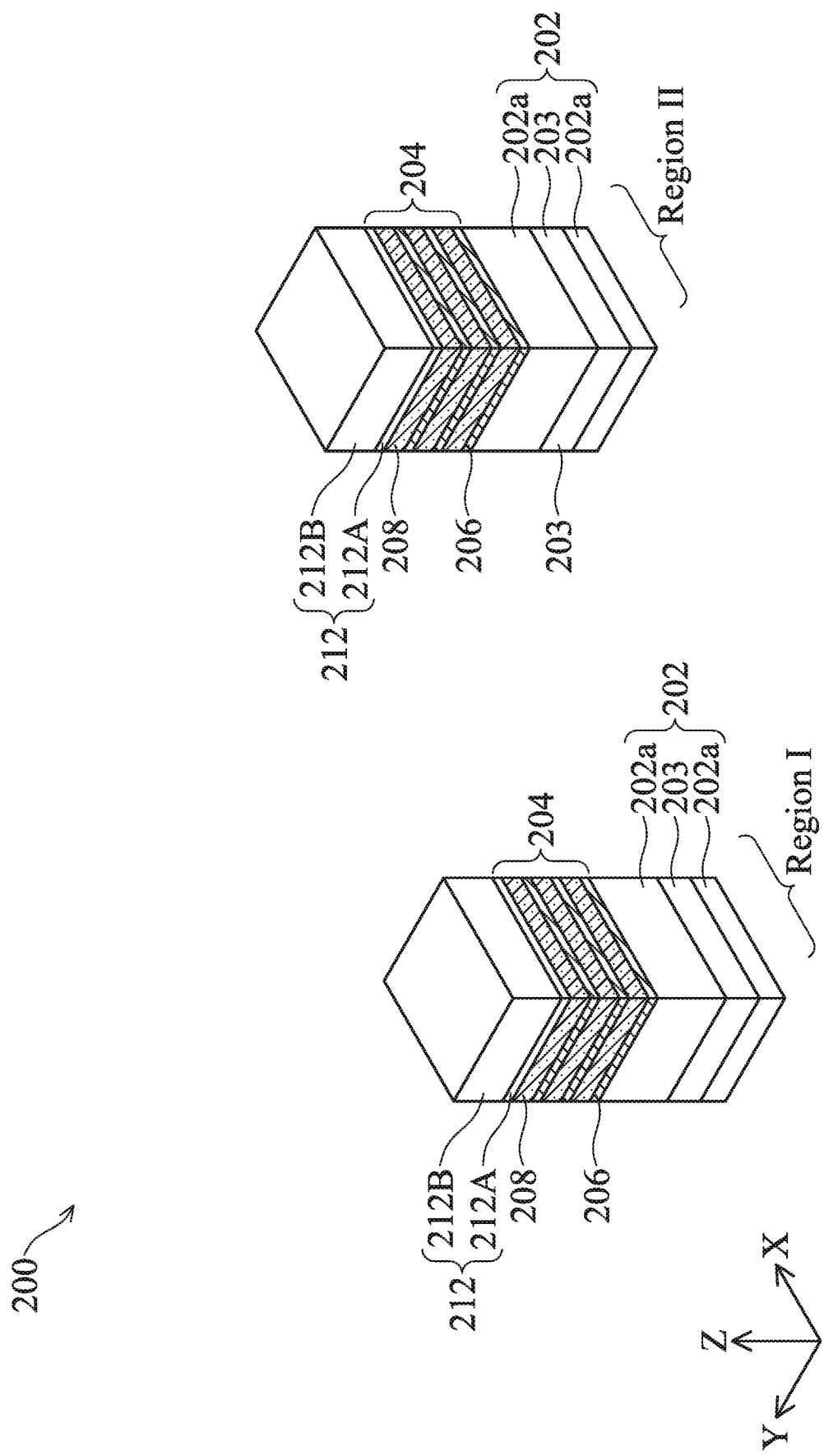
FIGS. 2, 3, and 4 illustrate perspective views of a portion of the semiconductor structure during fabrication processes according to the method of FIGS. 1A-1C, in accordance with some embodiments of the present disclosure.
Figure 3:
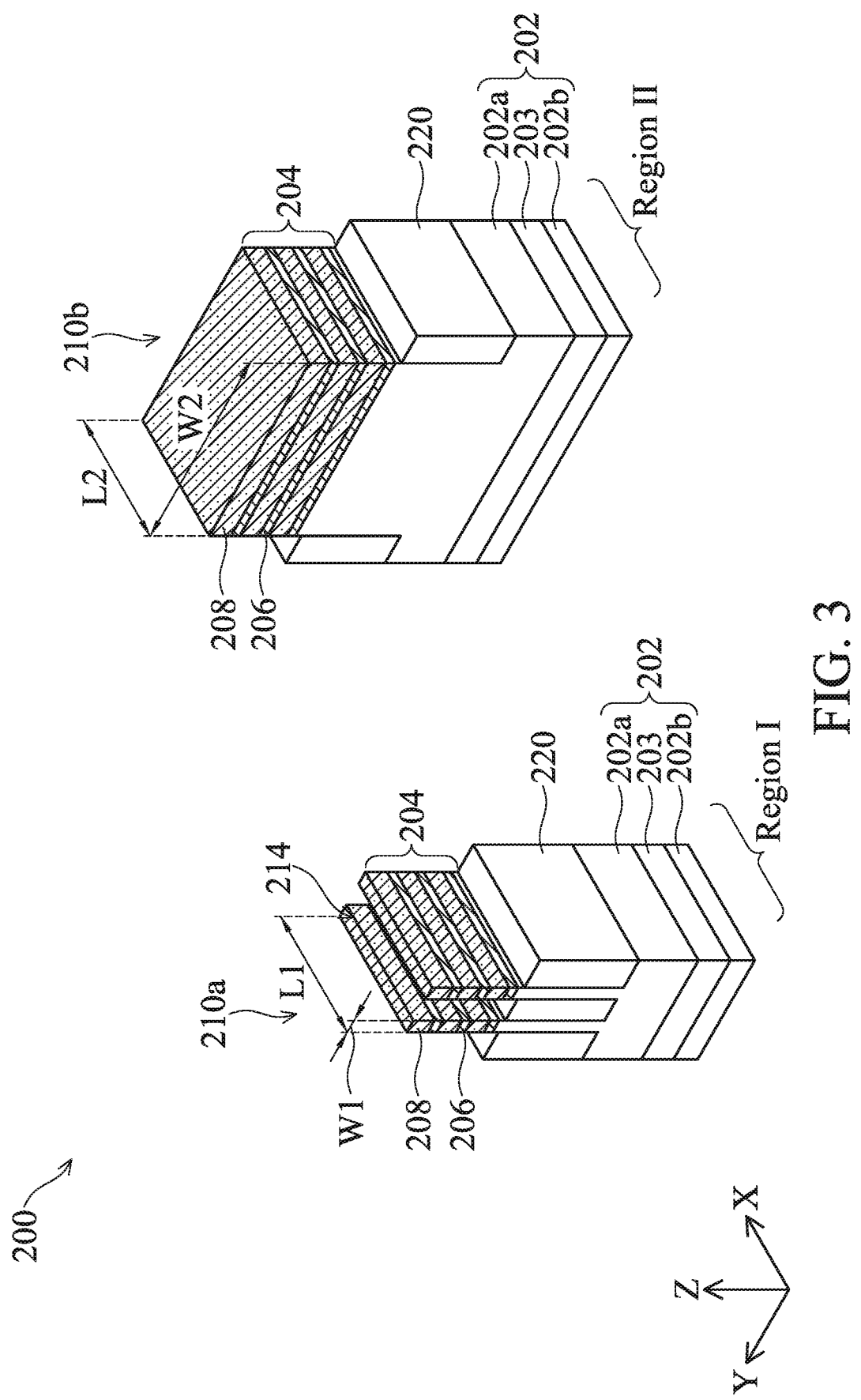
Figure 4:
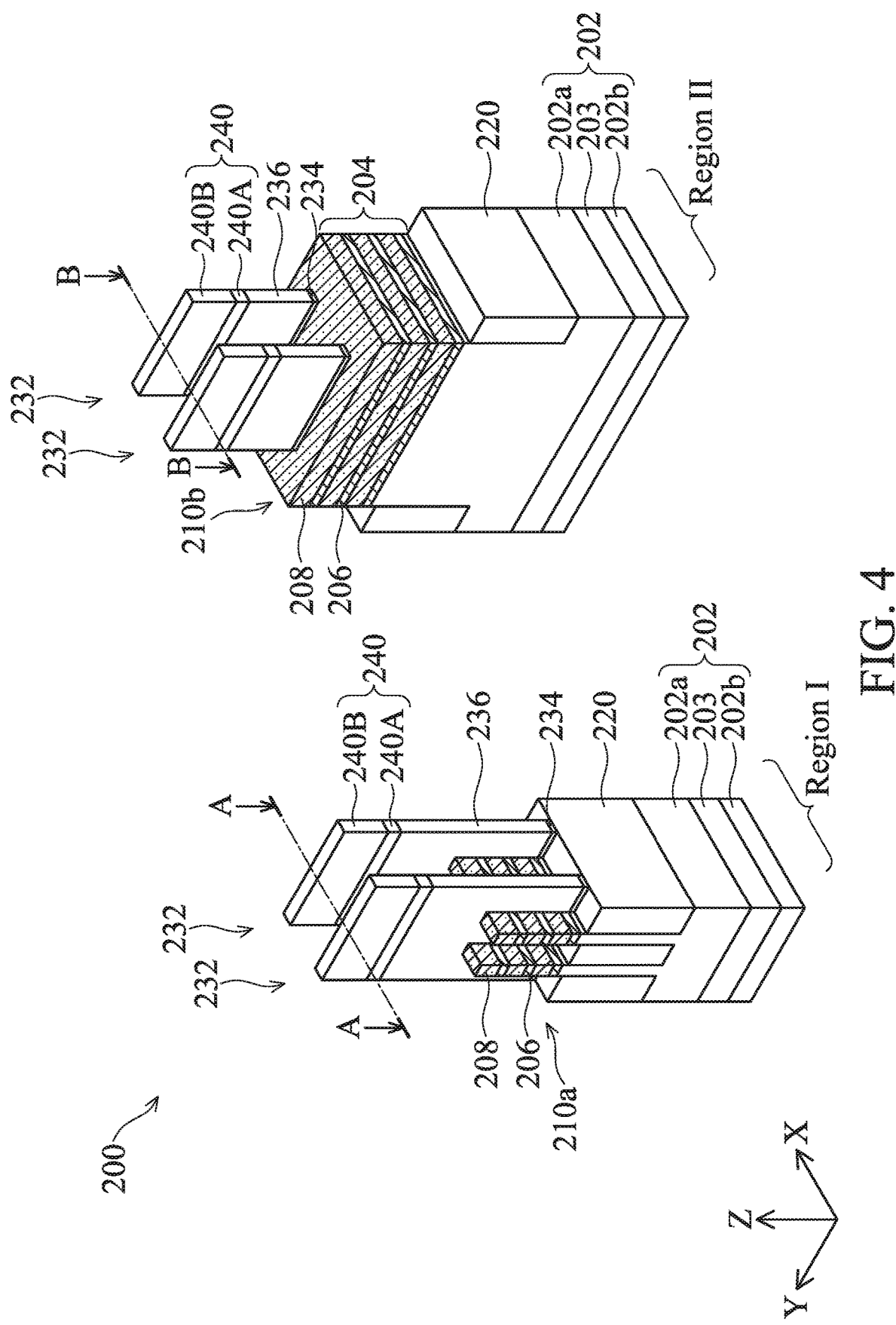

Illustrated in FIGS. 1A-1C is a method 100 of semiconductor fabrication including forming multi-gate transistors together with ESD devices (e.g., ESD diodes). The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-23B. FIGS. 2-23B have been simplified for the sake of clarity to better understand the inventive concepts of the present disclosure. FIGS. 2-4 illustrate perspective views of a semiconductor device (or device, or structure) 200 according to various stages of the method 100. FIGS. 5A, 5B, 16A, and 16B illustrate top views of the device 200 according to various stages of the method 100. FIGS. 6A, 7A, 8A, 9A, 10A, 11A, 12A, 13A, 14A, 15A, 17A, 18A, 19A, 20A, 21A, 22A, and 23A illustrate cross-sectional views along the A-A line of a portion of the device 200 in FIG. 5A which is in a channel region of a GAA transistor and along a lengthwise direction of the channel layers of the GAA transistor, according to various stages of the method 100. FIGS. 6B, 7B, 8B, 9B, 10B, 11B, 12B, 13B, 14B, 15B, 17B, 18B, 19B, 20B, 21B, 22B, and 23B illustrate cross-sectional views along the B-B line of a portion of the device 200 in FIG. 5A which is along a lengthwise direction of a fin element (or fin) in an ESD device.

In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. Additional features can be added in the device 200, and some of the features described below can be replaced, modified, or eliminated in other embodiments of the device 200.

The method 100 at operation 102 (FIG. 1A) provides (or is provided with) the device 200. Referring to FIG. 2, the device 200 includes a region I for forming transistors and a region II for forming ESD devices. The transistors formed in the region I are for core applications such as for forming logic circuits, memory circuits, and other core circuits. The ESD devices, such as ESD diodes, formed in the region II are for protecting the device 200 from electrostatic discharging events. The device 200 includes a substrate 202 and an epitaxial stack 204 above the substrate 202. Both the substrate 202 and the epitaxial stack 204 extend continuously from the region I to the region II. Further, a hard mask (HM) layer 212 is formed over the epitaxial stack 204.

In some embodiments, the substrate 202 is a semiconductor substrate such as a silicon substrate. The substrate 202 may include various layers, including conductive or insulating layers formed on a semiconductor substrate. In the illustrated embodiment, the substrate 202 includes a dielectric capping layer 203. In some embodiments, the dielectric capping layer 203 is an oxide layer. The dielectric capping layer 203 may be deposited using chemical vapor deposition (CVD), atomic layer deposition (ALD), physical vapor deposition (PVD), or oxidation. The dielectric capping layer 203 separates the substrate 202 into a top substrate portion 202a and a bottom substrate portion 202b. In some embodiments, the dielectric capping layer 203 serves as an etch stop or a chemical mechanical polishing (CMP) stop during a backside thinning process.

The substrate 202 may also include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 cm$^{-3}$ to about 1×10$^{17}$ cm 3), where for example, no intentional doping is performed during the epitaxial growth process. By way of example, epitaxial growth of the epitaxial layers 206, 208 of the first composition or the second composition may be performed by a molecular beam epitaxy (MBE) process, a metalorganic chemical vapor deposition (MOCVD) process, and/or other suitable epitaxial growth processes. In various embodiments, the substrate 202 is a crystalline substrate, the epitaxial layers 206, 208 are crystalline semiconductor layers, and the epitaxial stack 204 is formed as a superlattice structure.

In some embodiments, each epitaxial layer 206 has a thickness ranging from about 2 nanometers (nm) to about 6 nm. The epitaxial layers 206 may be substantially uniform in thickness. Yet in the illustrated embodiment, the top epitaxial layer 206 is thinner (e.g., half the thickness) than other epitaxial layers 206 thereunder. In some embodiments, each epitaxial layer 208 has a thickness ranging from about 6 nm to about 12 nm. In some embodiments, the epitaxial layers 208 of the stack are substantially uniform in thickness. As described in more detail below, the epitaxial layers 208 or portions thereof may form channel layer(s) of the subsequently-formed GAA transistors in the region I and the thickness is chosen based on transistor performance considerations. The term channel layer(s) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel regions(s) may eventually be removed and serve to define a vertical distance between adjacent channel members for a subsequently-formed multi-gate device and the thickness is chosen based on device performance considerations. Accordingly, the epitaxial layers 206 may also be referred to as sacrificial layers, and epitaxial layers 208 may also be referred to as channel layers.

It is noted that three (3) layers of the epitaxial layers 206 and three (3) layers of the epitaxial layers 208 are alternately arranged as illustrated in FIG. 2, which is for illustrative purposes only and not intended to be limiting beyond what is specifically recited in the claims. It can be appreciated that any number of epitaxial layers can be formed in the epitaxial stack 204; the number of layers depending on the desired number of channels layers for the device 200. In some embodiments, the number of epitaxial layers 208 is between 2 and 10. It is also noted that while the epitaxial layers 206, 208 are shown as having a particular stacking sequence, where an epitaxial layer 208 is the topmost layer of the epitaxial stack 204, other configurations are possible. For example, in some cases, an epitaxial layer 206 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

In the illustrated embodiment, the hard mask (HM) layer 212 is formed over the epitaxial stack 204 prior to patterning in forming semiconductor fins. In some embodiments, the HM layer 212 includes an oxide layer 212A (e.g., a pad oxide layer that may include SiO$_2$) and a nitride layer 212B (e.g., a pad nitride layer that may include Si$_3$N$_4$) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, CVD-deposited oxide, and/or ALD-deposited oxide. In some embodiments, the HM layer 212 includes a nitride layer deposited by CVD and/or other suitable technique.

The method 100 then proceeds to operation 104 (FIG. 1A) where fin elements (or fins) 210 are formed by patterning the epitaxial stack 204 by using the patterned mask layer 212. With reference to the example of FIG. 3, in an embodiment of operation 104, a plurality of fins 210 extending from the substrate 202 are formed extending lengthwise in the X direction, including fins 210a in the region I and fins 210b in the region II. In the illustrated embodiment, two fins 210a are arranged in the Y direction in the region I and one fin 210b is depicted in the region II. But the number of the fins 210a or 210b is not limited to and may be as small as one or three or more. In various embodiments, each of the fins 210 includes an upper portion constituted by the stacked epitaxial layers 206 and 208, and a lower portion formed from the substrate 202. The width W1 of the upper portion of the fins 210a in the region I along the Y direction is in a range from about 10 nm to about 40 nm in some embodiments. The width W2 of the upper portion of the fins 210b in the region II along the Y direction is wider than W1, such as in a range from about 50 nm to about 1000 nm in some embodiments. The length L1 of the upper portion of the fins 210a in the region I along the X direction and the length L2 of the upper portion of the fins 210b in the region II along the X direction may each range from about nm to about 900 nm in some embodiments. In the region I, the fins 210a may be designed for forming an NFET or a PFET. In the region II, the fins 210b may be designed for forming an ESD diode. A large width W2 of the fins 210b provides lower ESD resistance and stronger ESD current conductivity.

The fins 210 may be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending fins 210. The trenches 214 may be etched using dry etching, wet etching, RIE, and/or other suitable processes.

Numerous other embodiments of methods to form the semiconductor fins on the substrate may also be used including, for example, defining the fin region (e.g., by mask or isolation regions) and epitaxially growing the epitaxial stack 204 in the form of the fins 210. In some embodiments, forming the fins 210 may include a trim process to decrease the width of the fins 210. The trim process may include wet and/or dry etching processes. In some embodiments, the fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 by etching the epitaxial stack 204 and the substrate 202. The etching process can include dry etching, wet etching, reactive ion etching (RIE), and/or other suitable processes.

At operation 106, the method 100 (FIG. 1A) forms isolation structures, such as shallow trench isolation (STI) features, between the fins 210. Still referring to FIG. 3, STI features 220 is disposed on the substrate 202 interposing the fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers. In some embodiments of forming the STI features 220, after deposition of the dielectric layer, the deposited dielectric material is thinned and planarized, for example by a chemical mechanical polishing (CMP) process, such that the upper surface of the topmost epitaxial layer 208 is exposed. Subsequently, the dielectric layer interposing the fins 210 are recessed. As shown in FIG. 3, the STI features 220 are recessed providing the fins 210 extending above the STI features 220. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 210. In the illustrated embodiment, each of the layers of the epitaxial stack 204 is exposed. In furtherance of the embodiment, a top surface of the STI features 220 is recessed below a bottom surface of the epitaxial stack 204.

The method 100 then proceeds to operation 108 (FIG. 1A) where sacrificial layers/features are formed and in particular, dummy gate structures (or dummy gate stacks). While the present discussion is directed to a replacement gate (or gate-last) process whereby a dummy gate structure is formed and subsequently replaced, other configurations may be possible.

Figure 5A:
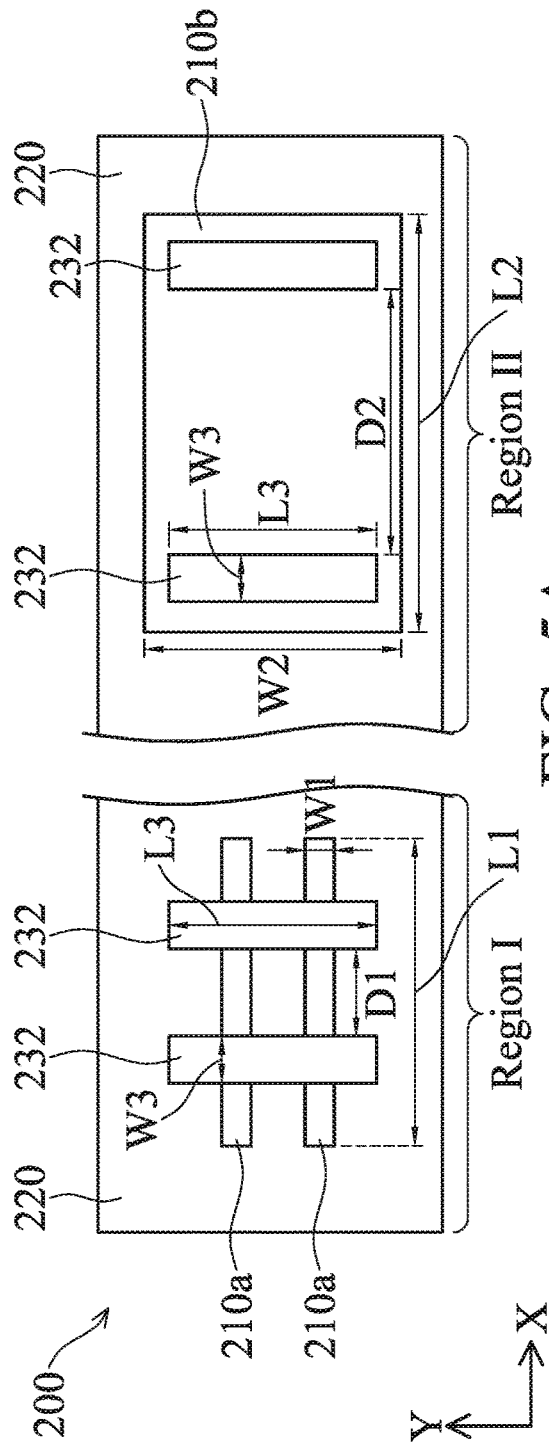
FIGS. 5A, 5B, 16A, and 16B illustrate top views of a portion of the semiconductor device during a fabrication process according to the method of FIGS. 1A-1C, in accordance with some embodiments of the present disclosure.
Figure 5B:
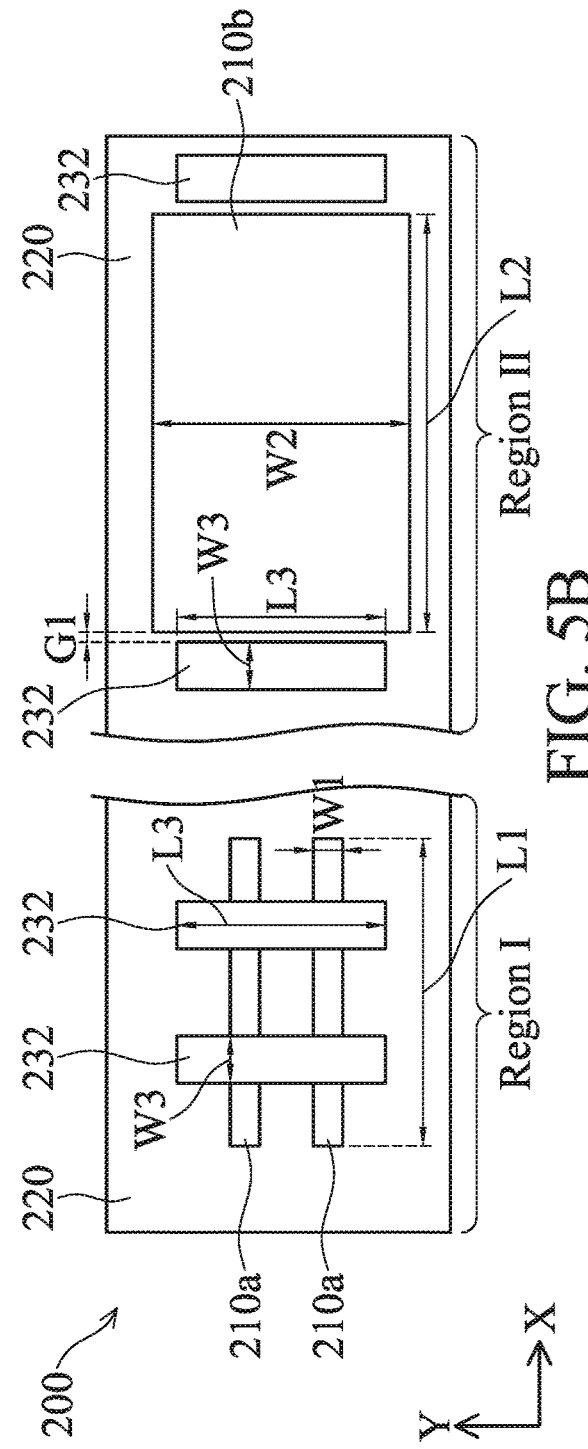
Figures 6A, 6B:
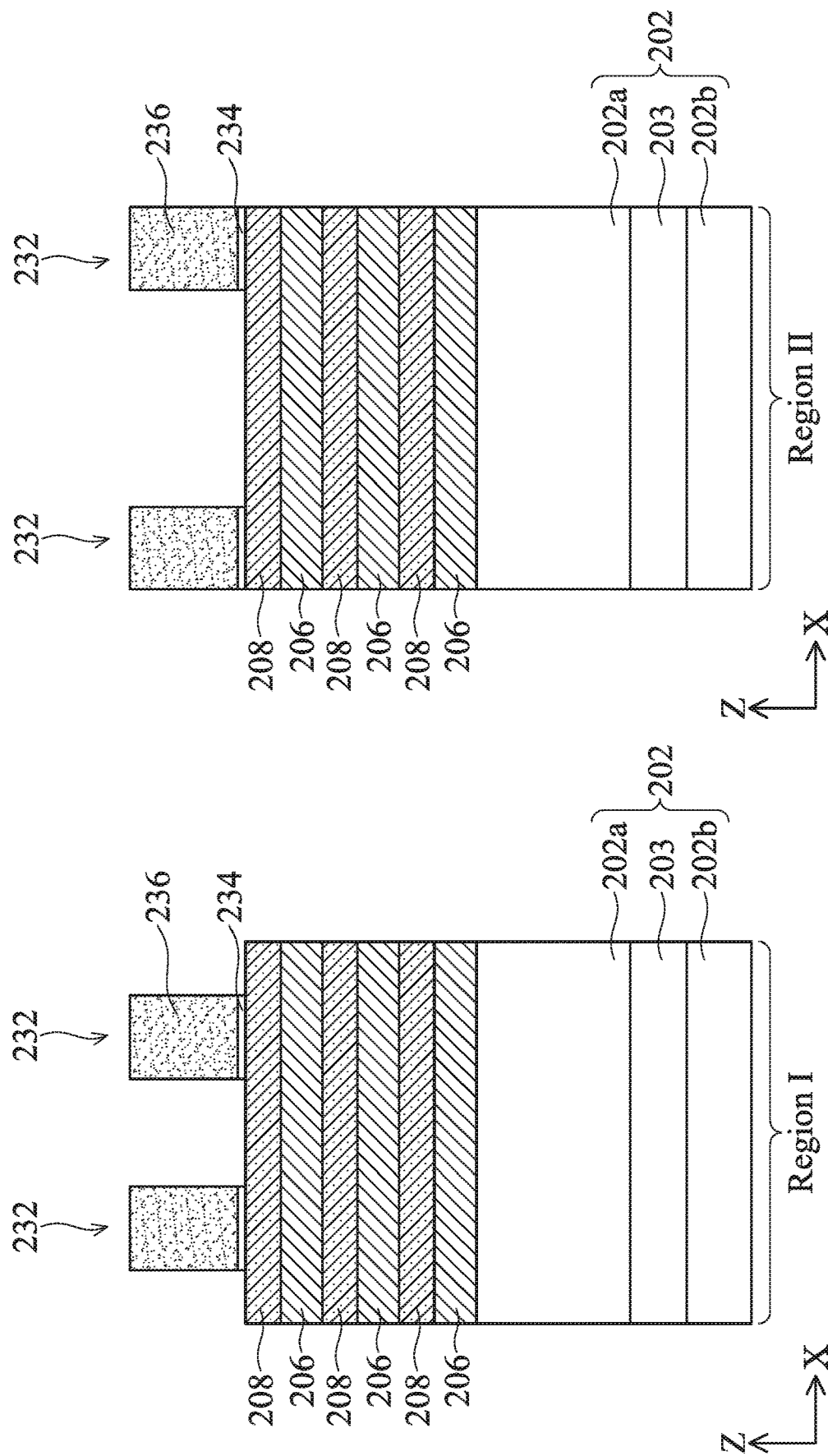

Referring to FIGS. 4, 5A-B, and 6A-B, gate stacks 232 are formed. FIG. 4 is a perspective view of the device 200, FIGS. 5A and 5B refer to top views of two embodiments of the device 200, FIG. 6A refers to a cross-sectional view in the region I taken in a fin 210a and along the lengthwise direction of the fin 210a (e.g., along the A-A line in FIG. 4), and FIG. 6B refers to a cross-sectional view in the region II taken in the fin 210b and along the lengthwise direction of the fin 210b (e.g., along the B-B line in FIG. 4). The gate stacks 232 are oriented lengthwise along the Y direction. The gate stacks 232 have a width W3 in a range from about 10 nm to about 100 nm and a length L3 in a range from about 40 nm to about 950 nm, in some embodiments. In the region I, the length L3 of the gate stacks 232 is larger than the width W1 of the fins 210a, and the gate stacks 232 engages the fins 210 from both the top surface and sidewalls of the fins 210a. The portion of the fins 210a underlying the dummy gate stacks 232 may be referred to as the channel region. The dummy gate stacks 232 may also define source/drain (S/D) regions of the fins 210a, for example, the regions of the fins 210a adjacent and on opposing sides of the channel region. A distance D1 between adjacent gate stacks 232 may range from about 30 nm to about 200 nm. In the region II, the length L3 of the gate stacks 232 is smaller than the width W2 of the fin 210b, and the gate stacks 232 are deposited above the top surface of the fin 210b but not on its sidewalls (FIG. 5A). A distance D2 between two adjacent gate stacks 232 in the region II is in a range from about 110 nm to about 1020 nm, which is larger than D1, in some embodiments. In some embodiments, a ratio of D2/L2 is not less than about 0.7. If the ratio of D2/L2 is less than 70%, the relative close distance between two adjacent gate stacks 232 may introduce unwanted stray capacitance and degrade ESD performance. In furtherance of some embodiments, the ratio of D2/L2 is larger than 1, which is that the distance D2 being larger than the length L2 of the fin 210b and the gate stacks 232 being deposited on the STI features 220 that surrounds the fin 210b (FIG. 5B). A gap G1 between two opposing edges of the gate stacks 232 and the fin 210b may range from about 10 nm to about 60 nm.

In various embodiments, the gate stacks 232 are a dummy (sacrificial) gate stacks that are subsequently removed. Thus, in some embodiments using a gate-last process, the gate stacks 232 are dummy gate stacks and will be replaced by the final gate stack at a subsequent processing stage of the device 200. In particular, the dummy gate stacks 232 may be replaced at a later processing stage by a high-K dielectric layer (HK) and metal gate electrode (MG) as will be discussed in more detail below.

In some embodiments, the dummy gate stack 232 includes a dummy dielectric layer 234 and a dummy electrode layer 236. In some embodiments, the dummy dielectric layer 234 may include $SiO_2$, silicon nitride, a high-K dielectric material and/or other suitable material. In various examples, the dummy dielectric layer 234 may be deposited by a CVD process, a subatmospheric CVD (SACVD) process, a flowable CVD process, an ALD process, a PVD process, or other suitable process. By way of example, the dummy dielectric layer 234 may be used to prevent damages to the fins 210 by subsequent processes (e.g., subsequent formation of the dummy gate stack). Subsequently, other portions of the dummy gate stack 232 are formed, including a dummy electrode layer 236 and a hard mask 240 which may include multiple layers 240A and 240B (e.g., an oxide layer 240A and a nitride layer 240B). In some embodiments, the dummy gate stacks 232 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 236 may include polycrystalline silicon (polysilicon). In some embodiments, the hard mask 240 includes an oxide layer 240A such as a pad oxide layer that may include $SiO_2$. In some embodiments, hard mask 240 includes a nitride layer 240B such as a pad nitride layer that may include $Si_3N_4$, silicon oxynitride and/or silicon carbide.

In the following figures, for the sake of conciseness, the manufacturing operations after the structure shown in FIG. 5A is formed, in which the dummy gate stacks are deposited directly above the fin 210b, are explained. However, the same operations can be applied to the structure shown in FIG. 5B, in which the dummy gate stacks are deposited directly above the STI features 220.

Figures 7A, 7B:
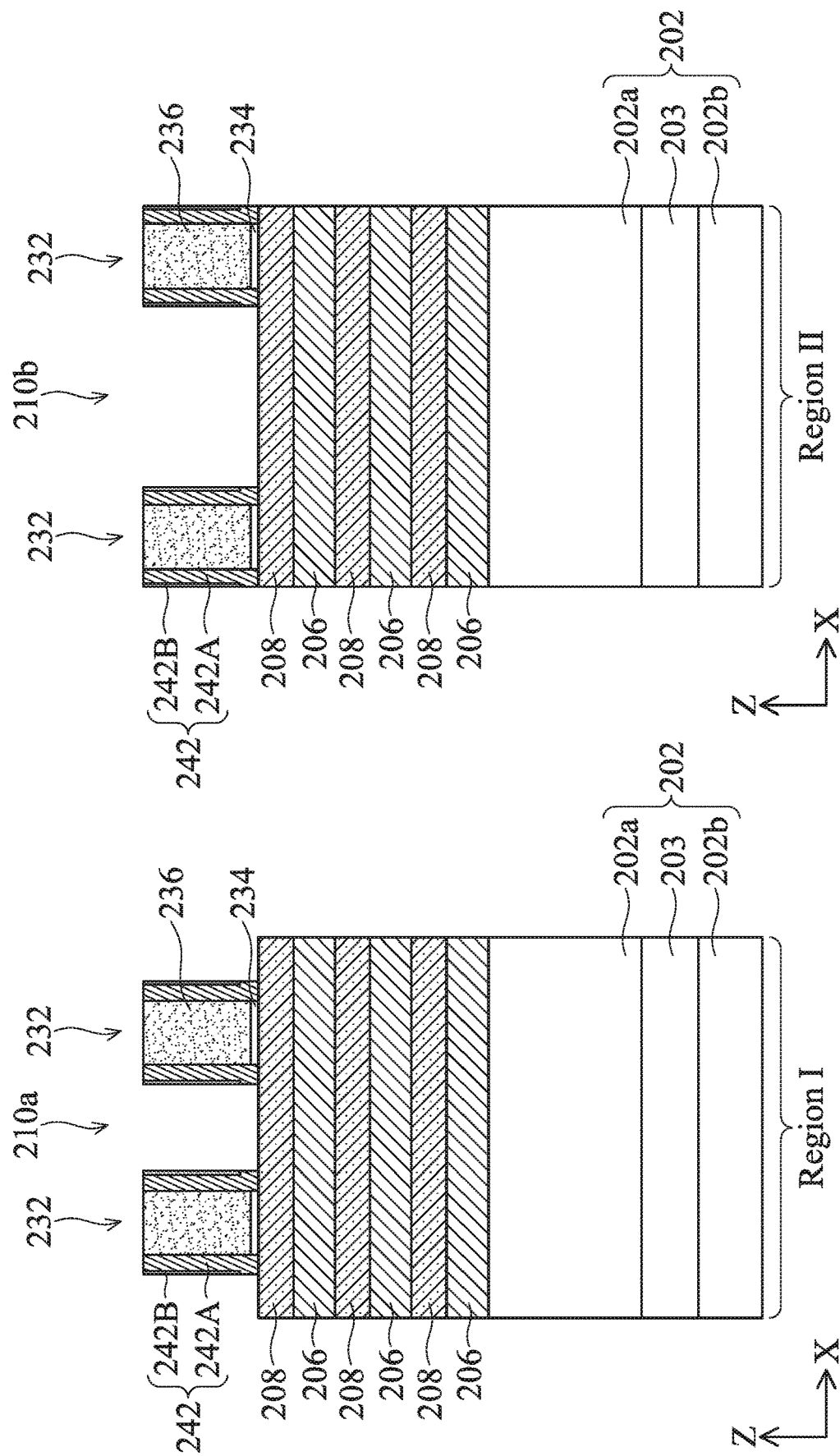

At operation 110, the method 100 (FIG. 1A) forms gate spacers 242 on sidewalls of the dummy gate stacks 232. Referring to FIGS. 7A and 7B, the gate spacers 242 may have a thickness of about 2-10 nm. In some examples, the gate spacers 242 may include a dielectric material such as silicon oxide, silicon nitride, silicon carbide, silicon oxynitride, SiCN, silicon oxycarbide, SiOCN, a low-K material, and/or combinations thereof. In some embodiments, the gate spacers 242 include multiple layers, such as a liner spacer layer 242A and a main spacer layer 242B, and the like. By way of example, the gate spacers 242 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 242 may be etched-back to expose portions of the fins 210 not covered by the dummy gate stacks 232. In some cases, the etch-back process removes portions of dielectric material used to form the gate spacers 242 along a top surface of the dummy gate stacks 232. In some embodiments, the etch-back process may include a wet etch process, a dry etch process, a multiple-step etch process, and/or a combination thereof. It is noted that after the etch-back process, the gate spacers 242 remain disposed on sidewalls of the dummy gate stacks 232.

Figures 8A, 8B:
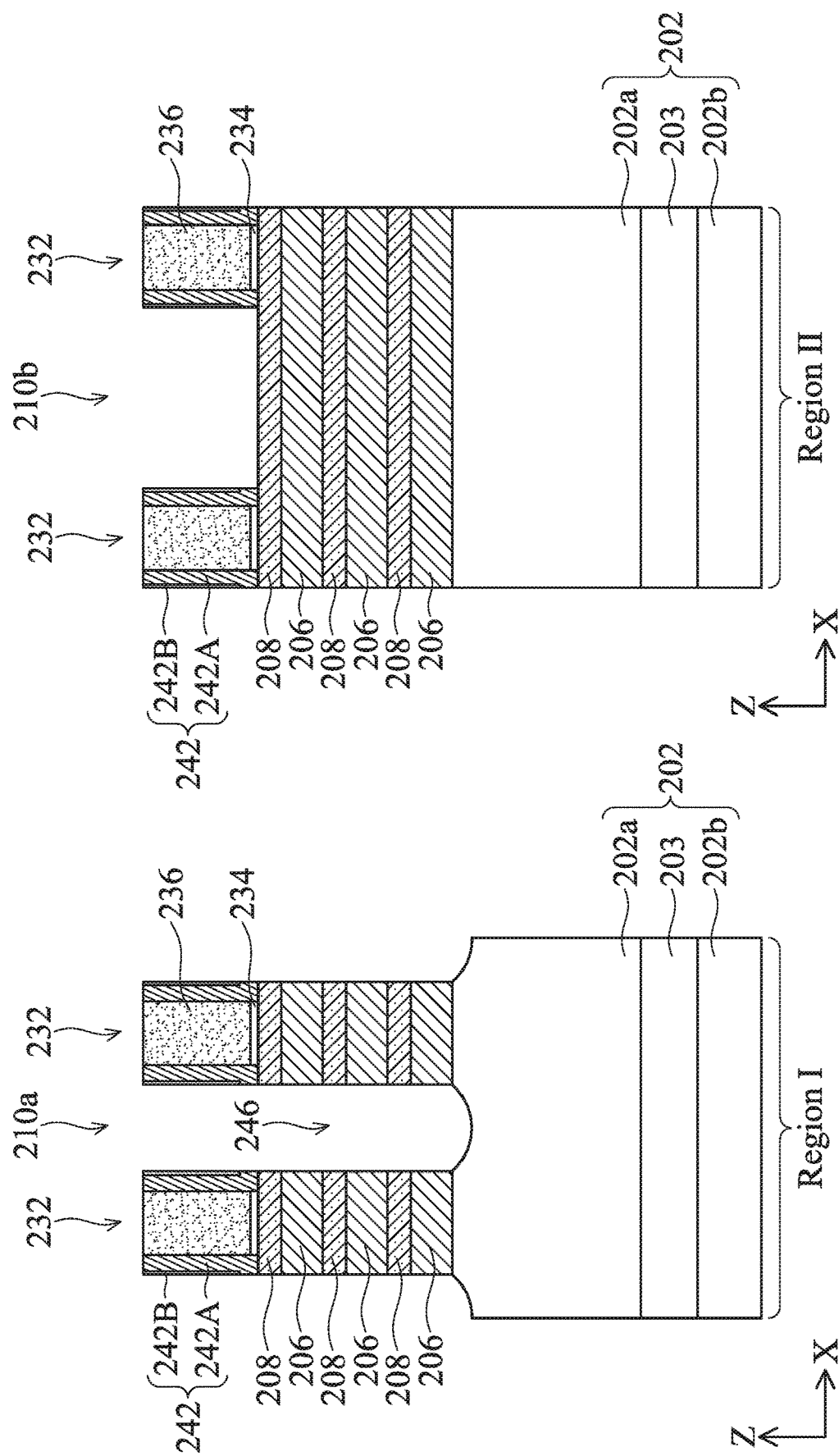

At operation 112, the method 100 (FIG. 1A) etches the S/D regions in the region I to form recesses 246. The recesses 246 are also referred to as S/D trenches 246. Referring to FIGS. 8A and 8B, in some embodiments of operation 112, an etch mask (not shown) is formed above the device 200. The etch mask provides openings over the region I, allowing the S/D regions of the fins 210a to be recessed through the openings, while protecting the region II from etching loss. The operation 112 then applies an etching process that is tuned to be selective to the materials of the semiconductor material (e.g. silicon and silicon germanium) in the fins 210a and with no (or minimal) etching to the dummy gate stacks 232 and the STI features 220. In the present embodiment, the etching process recesses the fins 210a in the S/D regions to a level that is below the bottommost epitaxial layer 206. Terminal ends of the epitaxial layers 206 and 208 are exposed in the S/D trenches 246. The etching process can be dry etching, wet etching, reactive ion etching, or other etching methods. The etch mask is subsequently removed, for example, by a resist stripping process or other suitable process.

At operation 114, the method 100 (FIG. 1A) forms inner spacers 248 on terminal ends of the epitaxial layer 206 in the region I. Referring to FIGS. 9A and 9B, in some embodiments, the inner spacers 248 include a dielectric material that includes silicon, oxygen, carbon, nitrogen, other suitable material, or combinations thereof (for example, silicon oxide, silicon nitride, silicon oxynitride, silicon carbide, or silicon oxycarbonitride). The inner spacers 248 may be formed by deposition and etching processes. For example, after the S/D trenches 246 are formed, a lateral etch process may be used to recess the epitaxial layers 206 to form cavities vertically between the adjacent epitaxial layers 208. Then, one or more dielectric materials are deposited (using CVD or ALD for example) to fill the cavities. Another etching process is performed to remove the dielectric materials outside the cavities, thereby forming the inner spacers 248.

At operation 116, the method 100 (FIG. 1A) further extends downwardly an S/D trench 246 in a source region (thereby as a source trench 246) into the top substrate portion 202a in an etch process and forms a bottom S/D layer 252 in the source trench 246. The resultant structure is shown in FIGS. 10A and 10B according to an embodiment. In the illustrated embodiment, the operation 114 first forms an etch mask 250 over the device 200. In some embodiments, the etch mask 250 is a liner layer conformally deposited on the device 200. The etch mask 250 provides an opening in the region I over a source trench 246 between adjacent dummy gate stacks 232, while drain trenches 246 and the region II remain covered. In various embodiments, the opening of the etch mask 250 may be provided over the drain trench only, source trench only, or both source and drain trenches. In the present disclosure, a source and a drain are interchangeably used. The etch mask 250 includes a material that is different than a semiconductor material in the top substrate portion 202a to achieve etching selectivity during further etching the source trench 246. For example, the etch mask 250 includes a resist material (and thus may be referred to as a patterned resist layer and/or a patterned photoresist layer). The operation 116 further includes etching the top substrate portion 202a through the etch mask 250 to extend downwardly the source trench 246. The etching process can be dry etching, wet etching, reactive ion etching, or other suitable etching methods, to selectively recess the source trench 246 to the desired level. The operation 116 subsequently fills the bottom portion of the extended source trench 246 with a bottom S/D layer 252 that has etching selectivity with the semiconductor material in the top substrate portion 202a. In some embodiments, the bottom S/D layer 252 is a dielectric layer that may include one or more dielectric material selected from $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, and other suitable material(s), and may be formed by PE-CVD, F-CVD or other suitable methods. In some embodiments, the bottom S/D layer 252 may include semiconductor material(s) so long as etching selectivity is achieved between the bottom S/D layer 252 and the top substrate portion 202a. For example, the bottom S/D layer 252 may include SiGe, and may be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The bottom S/D layer 252 reserves a space for a subsequently-formed backside S/D contact. In the illustrated embodiment, the bottom S/D layer 252 fills a bottom portion of the source trench 246 and is below the bottommost epitaxial layer 206. The etch mask 250 is subsequently removed, for example, by a resist stripping process or other suitable process.

Figure 11A:
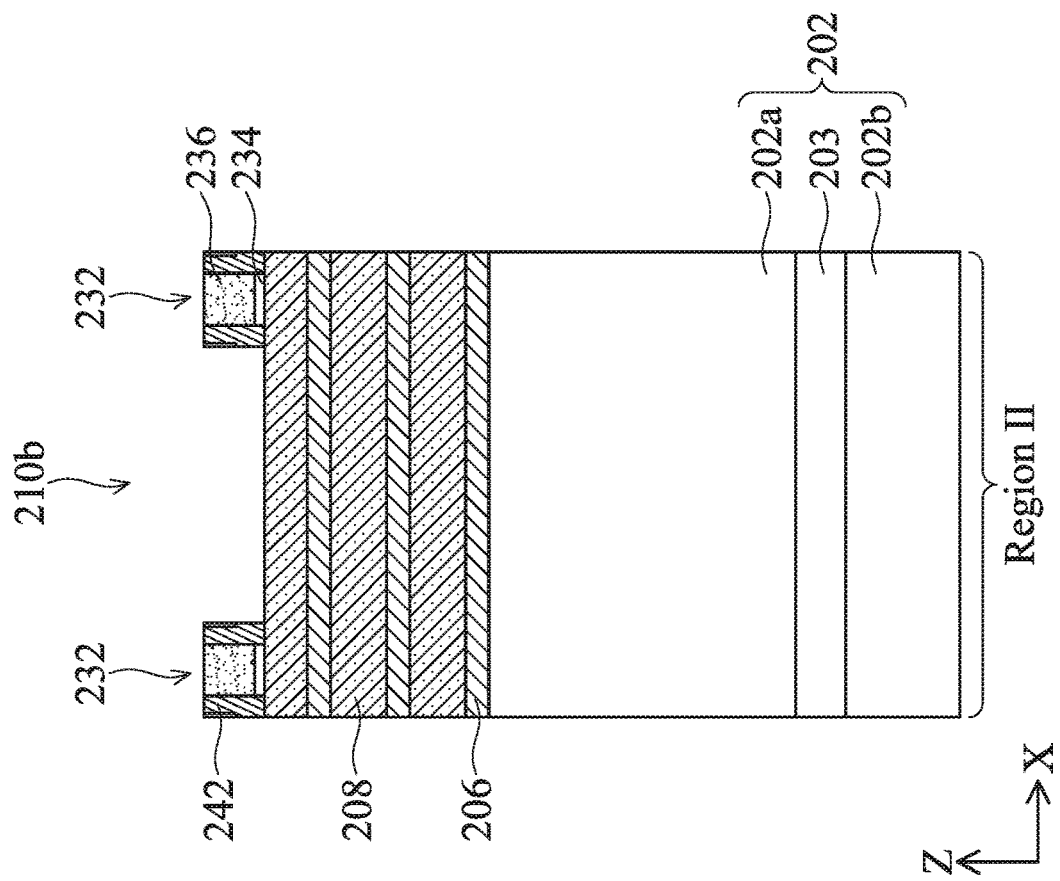
Figure 11B:
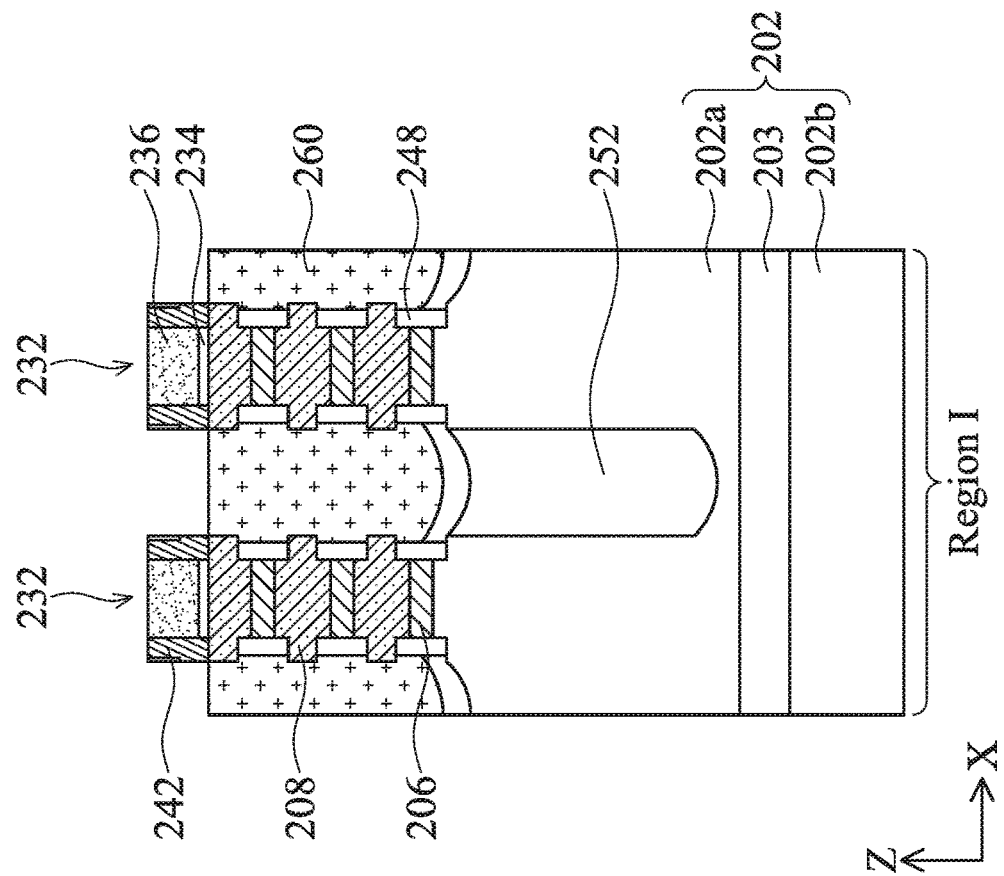

At operation 118, the method 100 (FIG. 1B) forms S/D features 260 in the S/D trenches 246 in the region I. The resultant structure is shown in FIGS. 11A and 11B according to an embodiment. In some embodiments, the operation 118 may include epitaxially growing semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the S/D features 260.

Figure 12B:
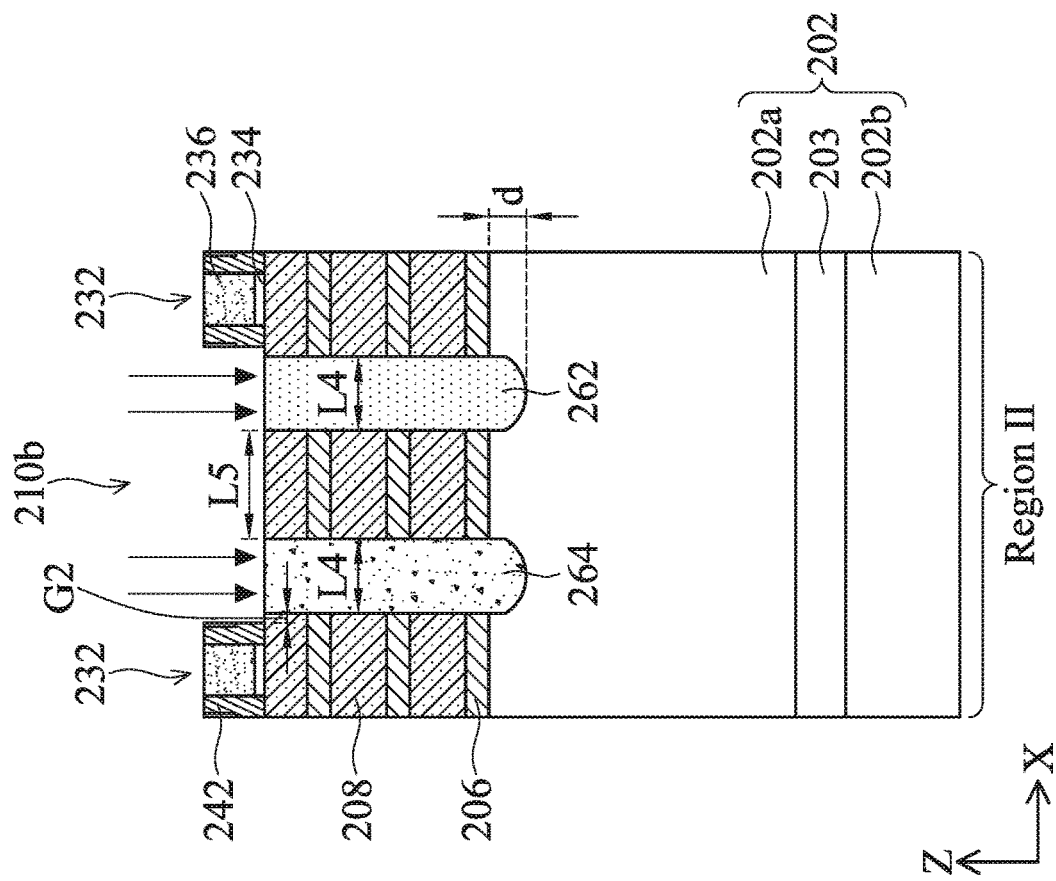
Figure 12A:
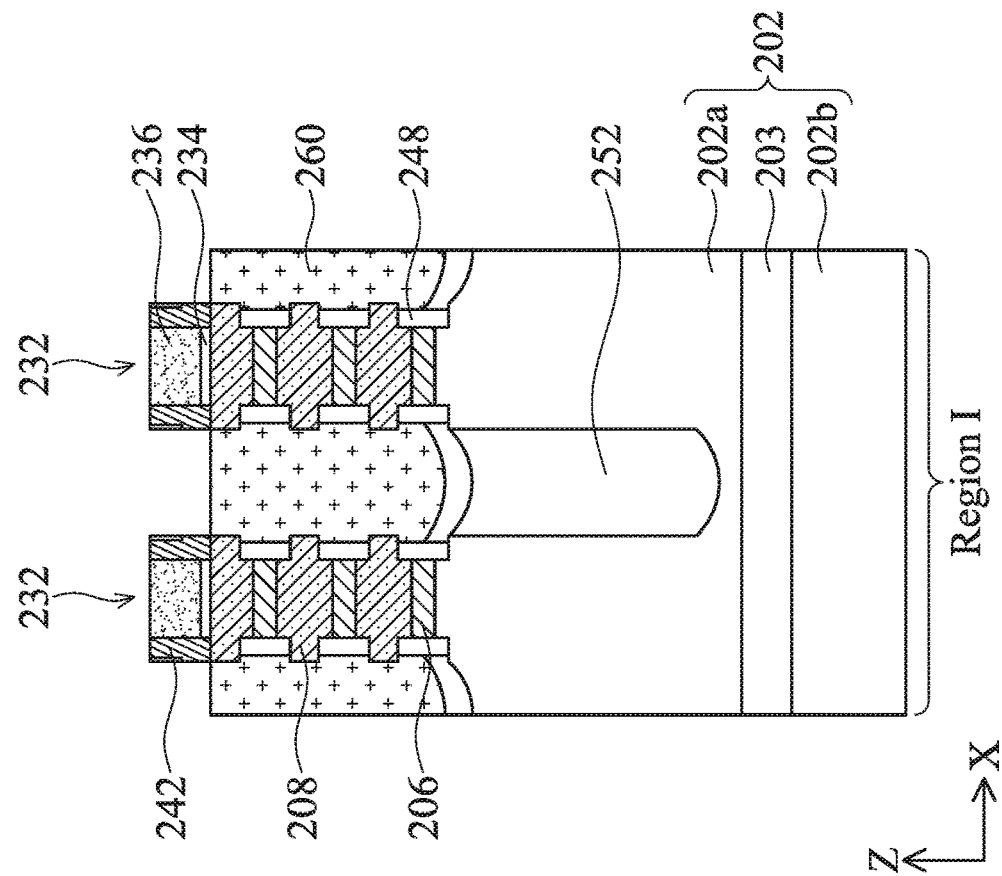

At operation 120, the method 100 (FIG. 1B) forms implanted P+ region and N+ region in the fin 210b in the region II to form ESD devices. The resultant structure is shown in FIGS. 12A and 12B according to an embodiment. The operation 120 may include performing an n-type impurity implantation (or doping) to form a heavily doped n-type region 262 (or N+ region 262) and performing a p-type impurity implantation to form a heavily doped p-type region 264 (or P+ region 264). Throughout the description, the term "heavily doped" indicates impurity concentrations of greater than about $10^{20}/cm^3$. However, it is appreciated that the term "heavily doped" is a term of art, and is related to the specific technology generation used for forming the integrated circuits of the embodiments. When the conductivity type is p-type, suitable impurities include boron, aluminum, or other suitable p-type dopants. When the conductivity type is n-type, suitable impurities include phosphorous, arsenic, or other suitable n-type dopants. In the illustrated embodiment, the implantations are bounded in regions between the adjacent dummy gate stacks 232 in the region II. As is known in the art, masks, such as resists, may be formed to cover regions not to be implanted. Each of the P+ region 264 and the N+ region 262 may have a width along the Y direction substantially equal to the width W2 of the fin 210b and a length L4 along the X direction ranging from about 30 nm to about 200 nm, in some embodiments. In the illustrated embodiment, a doping depth of the P+ region 264 and the N+ region 262 extends beyond the bottommost epitaxial layer 206 and into the top substrate portion 202a for a distance d. In one embodiment, the distance d ranges from about 0 nm to about 30 nm. Such a distance d improves RC performance of the ESD devices in the embodiment. A middle portion of the fin 210b may remain to be un-implanted. The un-implanted middle portion of the fin 210b is between and adjoining the N+ region 262 and the P+ region 264. Referring to FIG. 12B and also FIG. 16A for a top view, the un-implanted middle portion may have a length L5 along the X direction ranging from about 30 nm to about 500 nm, in some embodiments. In various embodiments, a ratio of L5/L4 ranges from about 0.2 to about 2.5. If the ratio is less than 0.2, the relative small distance between P+/N+ regions may cause dopants diffuse into each other and reduce effective implant region widths. If the ratio is larger than 2.5, the relatively large distance between P+/N+ regions may increase resistance along ESD paths and degrade ESD performance. In the illustrated embodiment, the dummy gate stacks 232 is laterally distant from the P+/N+ regions for a gap G2 (measured from sidewalls of the gate spacers 242) ranging from about 10 nm to about 60 nm. Alternatively, the dummy gate stacks 232 may abut with the P+/N+ regions (G2≈0) or even partially overlap with edges of the P+/N+ regions, respectively.

In the resulting structure after operation 120, a P-N junction is formed between the P+ region 264 and the N+ region 262. The P-N junction is along the lengthwise direction of the fin 210b. The resulting structure is an ESD diode in the illustrated embodiment. By having the P+/N+ regions in the same fin, instead of crossing multiple fins, the ESD current conductivity is enhanced and ESD parasitic capacitance is reduced. By having the dummy gate stacks and accordingly the subsequently-formed metal gate stacks outside of the P+/N+ regions, the ESD parasitic capacitance between ESD diodes and gate structures is further reduced. The relatively large width of the fin 210b also provides a low resistivity ESD current path that enhances the ESD device performance.

At operation 122, the method 100 (FIG. 1B) forms an inter-layer dielectric (ILD) layer 268 on sidewalls of the dummy gate stacks 232 and covering the fins 210. Referring to FIGS. 13A and 13B, in some embodiments of operation 122, a contact etch stop layer (CESL) 266 is also formed prior to forming the ILD layer 268. In some examples, the CESL 266 includes a silicon nitride layer, silicon oxide layer, a silicon oxynitride layer, and/or other materials known in the art. The CESL 266 may be formed by plasma-enhanced chemical vapor deposition (PECVD) process and/or other suitable deposition or oxidation processes. In some embodiments, the ILD layer 268 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 268 may be deposited by a PECVD process or other suitable deposition technique. In some embodiments, after formation of the ILD layer 268, the device 200 may be subject to a high thermal budget process to anneal the ILD layer. In some examples, after depositing the ILD layer 268, a planarization process may be performed to remove excessive dielectric materials. For example, a planarization process includes a CMP process which removes portions of the CESL 266 and the ILD layer 268 overlying the dummy gate stacks 232 and planarizes a top surface of the device 200. In some embodiments, the CMP process exposes the dummy electrode layer 236.

At operation 124, the method 100 (FIG. 1B) removes the dummy gate stack 232 to form gate trenches 270 in both the regions I and II, as shown in FIGS. 13A and 13B. A final gate structure (e.g., including a high-K dielectric layer and metal gate electrode) may be subsequently formed in the gate trench 270, as will be described below. Operation 124 may include one or more etching processes that are selective to the materials in the dummy dielectric layer 234 and the dummy electrode layer 236 of the dummy gate stacks 232. For example, the removal of the dummy gate stacks 232 may be performed using a selective etch process such as a selective wet etch, a selective dry etch, or a combination thereof. The epitaxial layers 206 and 208 of the fins 210a in the region I and the topmost epitaxial layer 208 of the fin 210b in the region II are exposed in the gate trenches 270.

At operation 126, the method 100 (FIG. 1B) removes the epitaxial layers 206 from the fins 210a exposed in the gate trenches 270 in the region I. The resultant structure is shown in FIGS. 13A and 13B according to an embodiment. In an embodiment, the epitaxial layers 206 include SiGe and the epitaxial layers 208 include Si, allowing for the selective removal of the epitaxial layers 206. In an embodiment, the epitaxial layers 206 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. In the region II, the topmost epitaxial layer 208 serves as an etch stop and protects the underneath epitaxial layers 206 from etching.

Figure 14A:
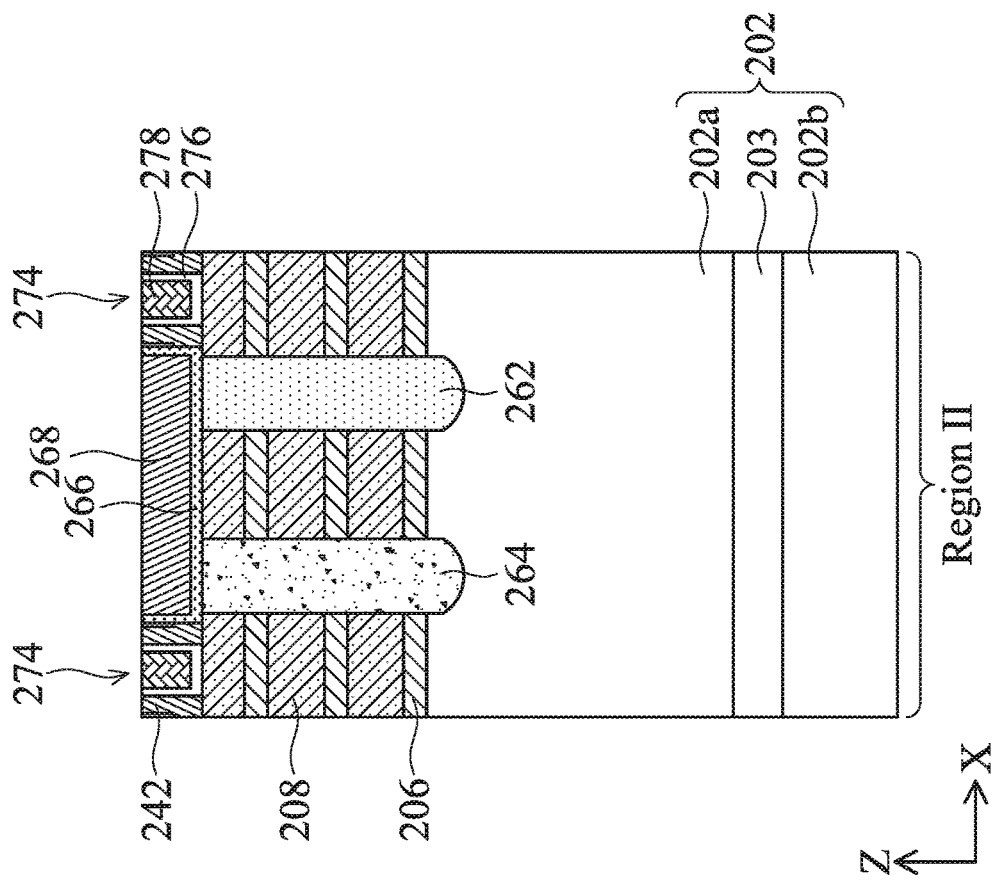
Figure 14B:
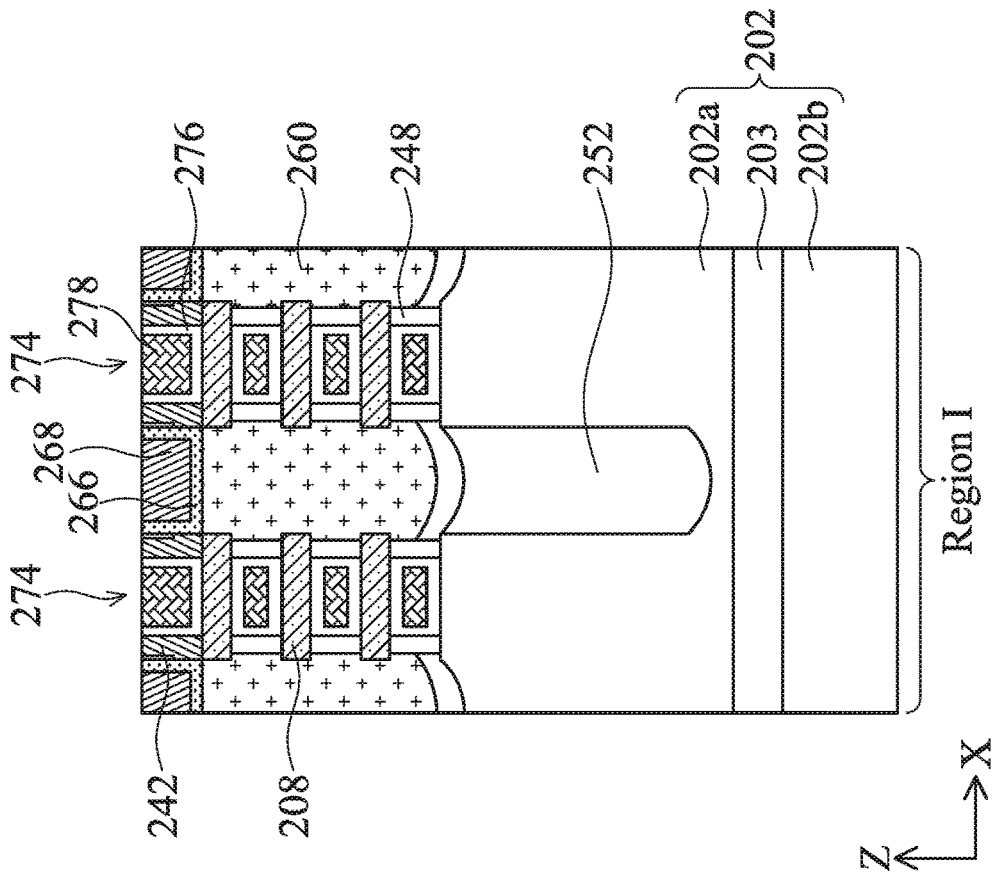

The method 100 then proceeds to operation 128 (FIG. 1B) where gate structures are formed. The resultant structure is shown in FIGS. 14A and 14B according to an embodiment. The gate structures may be high-K/metal gate (HK MG) stacks, however other compositions are possible. In some embodiments, the gate structures form the gate associated with the multi-channels provided by the plurality of channel layers (e.g., nanosheets or nanowires having gaps therebetween) in the channel regions in the region I. In an embodiment of operation 128, HK MG stacks 274 is formed within the gate trenches 270 of the device 200. In various embodiments, the HK MG stacks 274 include an interfacial layer (not shown), a high-K gate dielectric layer 276 formed over the interfacial layer, and a gate electrode layer 278 formed over the high-K gate dielectric layer 276. High-K gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stacks 274 and the S/D features 260 are the inner spacers 248, providing isolation.

In some embodiments, the interfacial layer of the HK MG stacks 274 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer 276 of the HK MG stack 274 may include a high-K dielectric such as hafnium oxide ($HfO_2$). Alternatively, the high-K gate dielectric layer 276 of the HK MG stack 274 may include other high-K dielectrics, such as $TiO_2$, HfZrO, $Ta_2O_3$, $HfSiO_4$, $ZrO_2$, ZrSiO2, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 276 may be formed by ALD, physical vapor deposition (PVD), CVD, oxidation, and/or other suitable methods.

The gate electrode layer 278 of the HK MG stacks 274 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 278 of HK MG stacks 274 may include Ti, Ag, Al, TiAlN, TaC, TaCN, TaSiN, Mn, Zr, TiN, TaN, Ru, Mo, WN, Cu, W, Re, Ir, Co, Ni, other suitable metal materials or a combination thereof. In various embodiments, the gate electrode layer 278 of the HK MG stacks 274 may be formed by ALD, PVD, CVD, e-beam evaporation, or other suitable process. Further, the gate electrode layer 278 may be formed separately for N-FET and P-FET transistors which may use different metal layers (e.g., for providing an N-type or P-type work function). In various embodiments, a CMP process may be performed to remove excessive metal from the gate electrode layer 278 of the HK MG stacks 274, and thereby provide a substantially planar top surface of the HK MG stacks 274. The HK MG stacks 274 includes portions that interpose each of the epitaxial layers (channel layers) 208, which form channels of the multi-gate transistors in the region I.

Figure 15B:
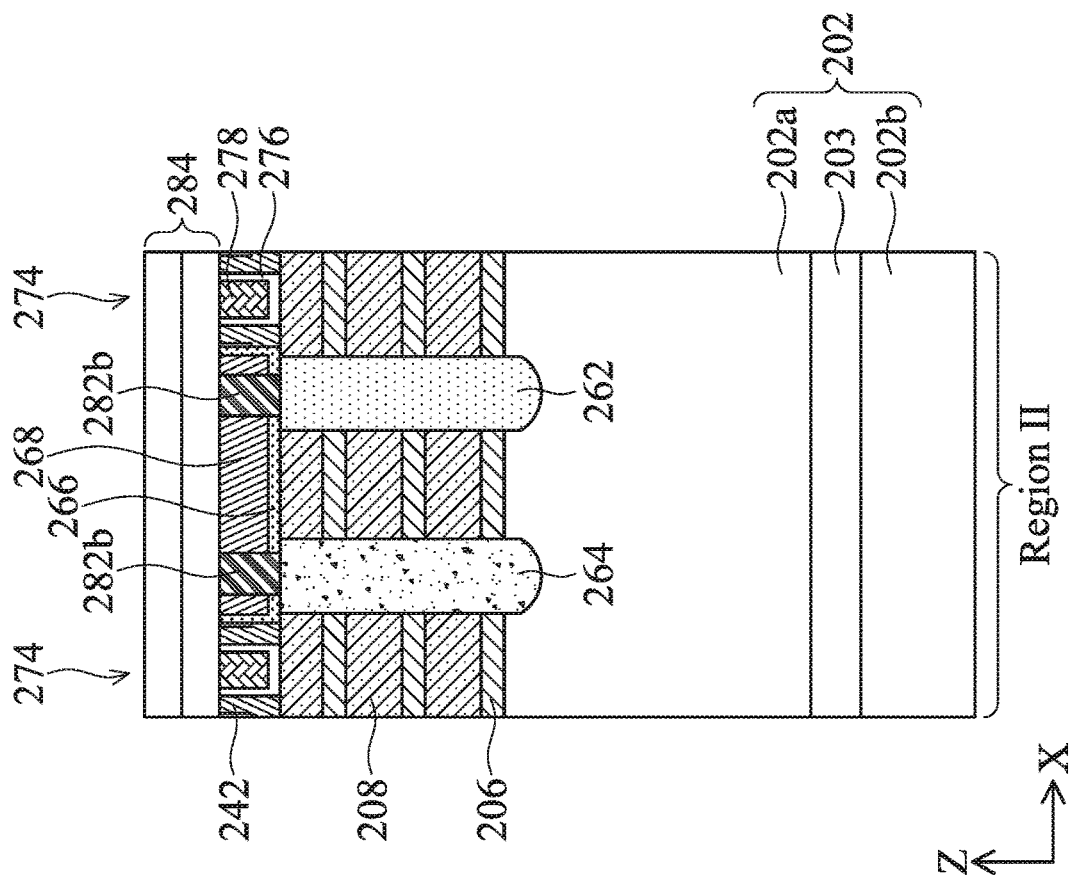
Figure 15A:
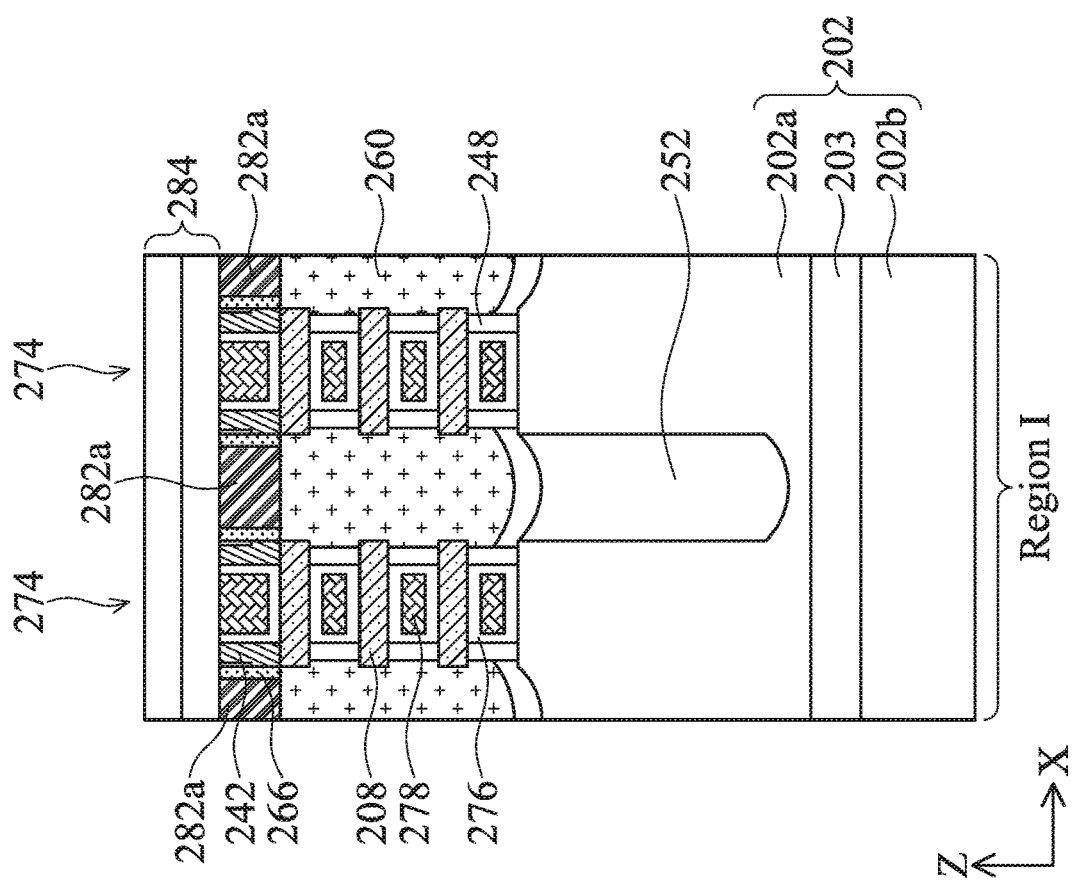

At operation 130, the method 100 (FIG. 1B) forms various features on the frontside of the device 200. For example, the operation 130 may form contact openings exposing underneath N+/P+ regions 262/264 by etching the ILD layer 268 and the CESL 266, contacts 282a landing on S/D features 260 in the region I and contacts 282b landing on N+/P+ regions 262/264 in the region II by filling the contact openings with conductive materials, as well as various other contacts/vias/lines and multilayers interconnect features (e.g., metal layers and interlayer dielectrics) on the frontside of the device 200 (denoted as metal wiring layer 284). The resultant structure is shown in FIGS. 15A and 15B according to an embodiment. In furtherance of the example, the metal wiring layer 284 may include a multi-layer interconnection, such as vertical interconnects (e.g., vias or contacts) and horizontal interconnects (e.g., metal lines). The various interconnection features may employ various conductive materials including copper, tungsten, and/or silicide. In one example, a damascene and/or dual damascene process is used to form a copper related multi-layer interconnection structure.

Figure 16A:
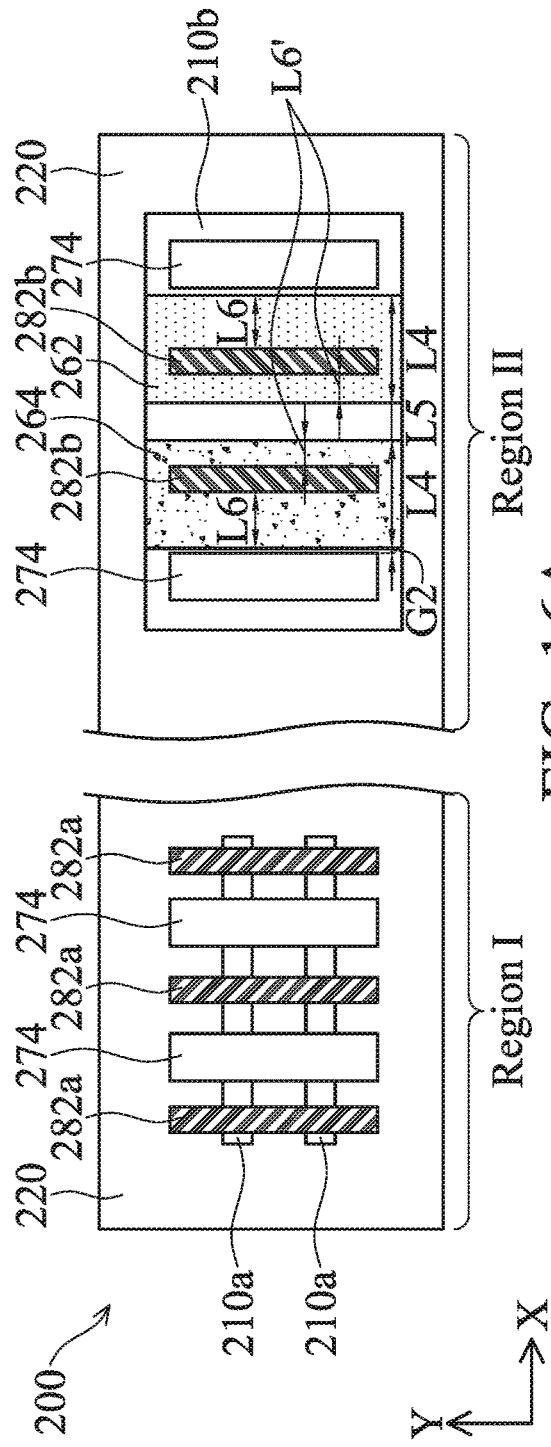
Figure 16B:
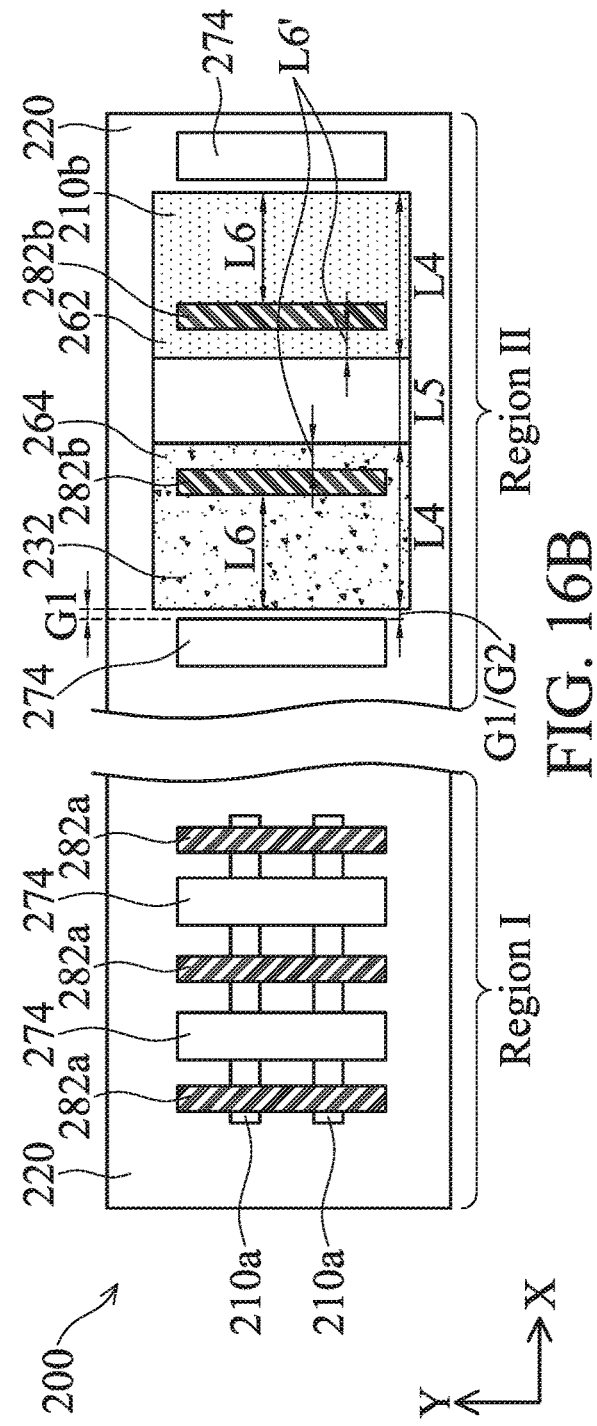

Referring to FIG. 16A depicting a top view of the device 200 after the operation 130 according to an embodiment, the contacts 282b in the region II are spaced along the X direction and extend along the Y direction. Each of the contacts 282b may have a width along the X direction ranging from about 10 nm to about 80 nm and a length along the Y direction ranging from about 40 nm to about 950 nm. The contacts 282b may be deposited in a portion of the P+/N+ regions 264/262 that has an edge-to-edge distance L6' to inside edges (i.e., opposing edges) of the P+/N+ regions and an edge-to-edge distance L6 to outside edges (i.e., edges facing HK MG stacks 274) of the P+/N+ regions, respectively. In various embodiments, L6' is less than L6. In other words, the contacts 282b are closer to the inside edges of the P+N+ regions than the outside edges. In some embodiment, a ratio of L6'/L6 is less than about 0.4. For example, the distance L6' may be less than about 10 nm and the distance L6 may range between about 30 nm to about 60 nm. Referring to FIG. 16B depicting a top view of the device 200 after the operation 130 according to yet another embodiment as discussed above in association with FIG. 5B, the gate stacks 274 are deposited on the STI features 220 and the P+/N+ regions extends to lateral ends of the fin 210b. A distance G1 between two opposing edges of the gate stacks 274 and the fin 210b is also a distance G2 between two opposing edges of the gate stacks 274 and the P+/N+ regions, respectively, in a range from about 10 nm to about 60 nm. By having the gate stacks 274 outside of the fin 210b, the ESD parasitic capacitance between ESD diodes and gate structures is further reduced.

Figure 17B:
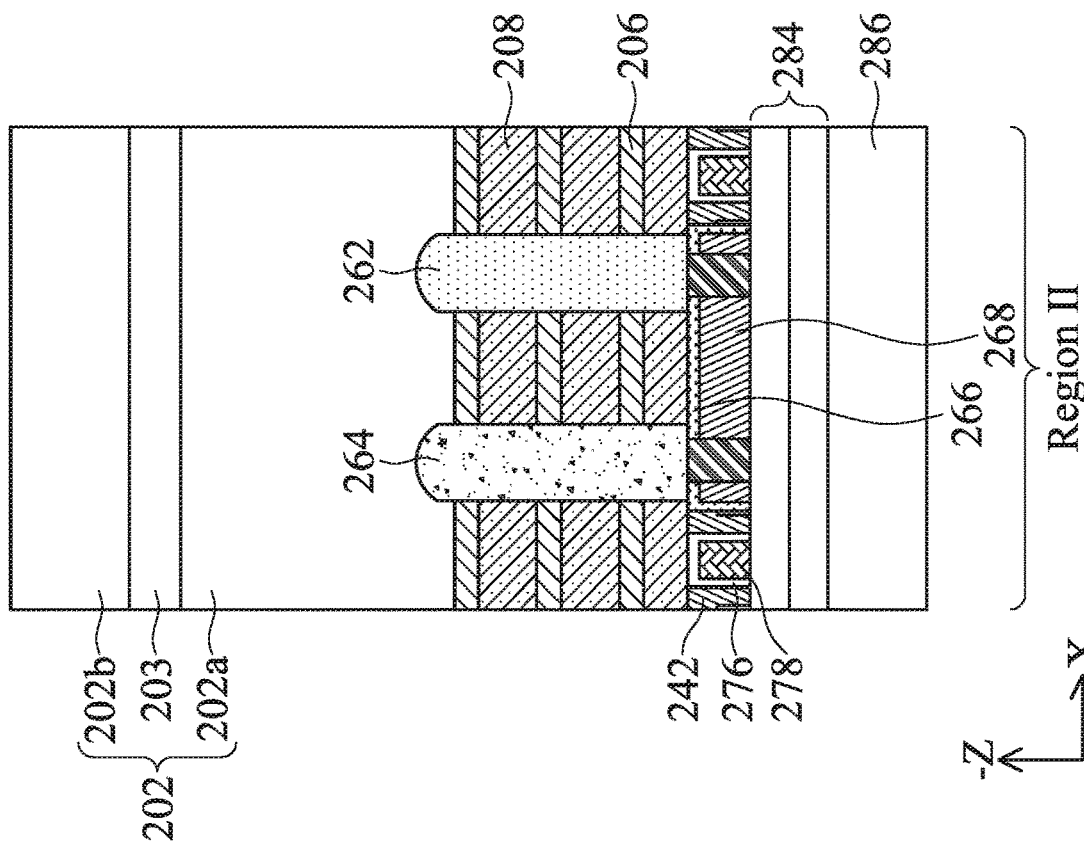
Figure 17A:
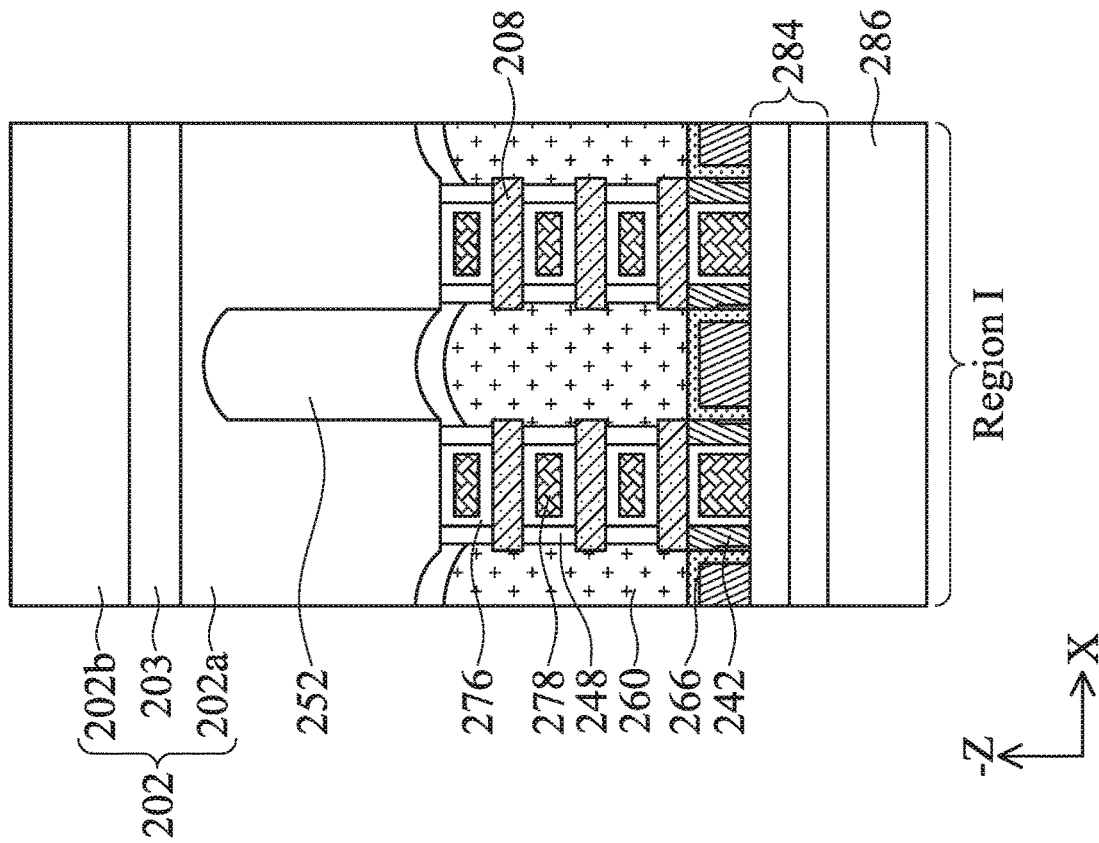

At operation 132, the method 100 (FIG. 1B) flips the device 200 upside down and attaches the frontside of the device 200 to a carrier 286, such as shown in FIGS. 17A and 17B. This makes the device 200 accessible from the backside of the device 200 for further processing. The operation 132 may use any suitable attaching processes, such as direct bonding, hybrid bonding, using adhesive, or other bonding methods. The operation 132 may further include alignment, annealing, and/or other processes. The carrier 286 may be a silicon wafer in some embodiments. In FIGS. 2-23B, the "z" direction points from the backside of the device 200 to the frontside of the device 200, while the "−z" direction points from the frontside of the device 200 to the backside of the device 200.

At operation 134, the method 100 (FIG. 1C) thins down the device 200 from the backside of the device 200 until the bottom S/D layer 252 is exposed from the backside of the device 200. The resultant structure is shown in FIGS. 18A and 18B according to an embodiment. The thinning process may include a mechanical grinding process and/or a chemical thinning process. A substantial amount of substrate material may be first removed from the substrate 202 during a mechanical grinding process. The dielectric capping layer 203 may serve as a CMP stop layer during the removal of the bottom substrate portion 202b. Afterwards, a chemical thinning process may apply an etching chemical to the backside of the substrate 202 to remove the dielectric capping layer 203 and further thin down the top substrate portion 202a until the bottom S/D layer 252 is exposed.

Figure 19B:
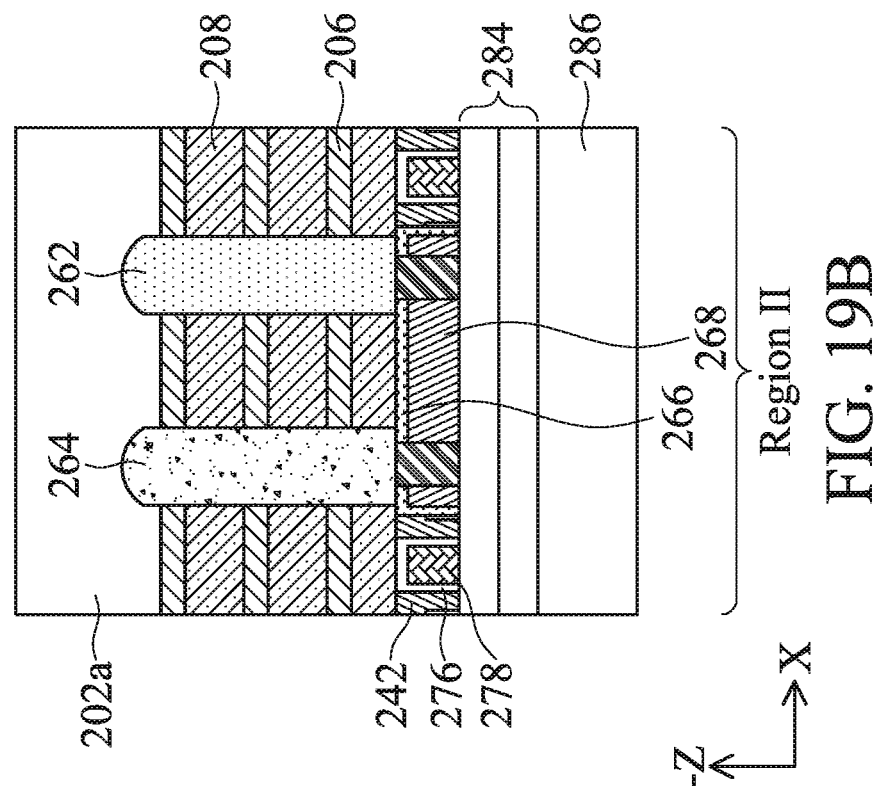
Figure 19A:
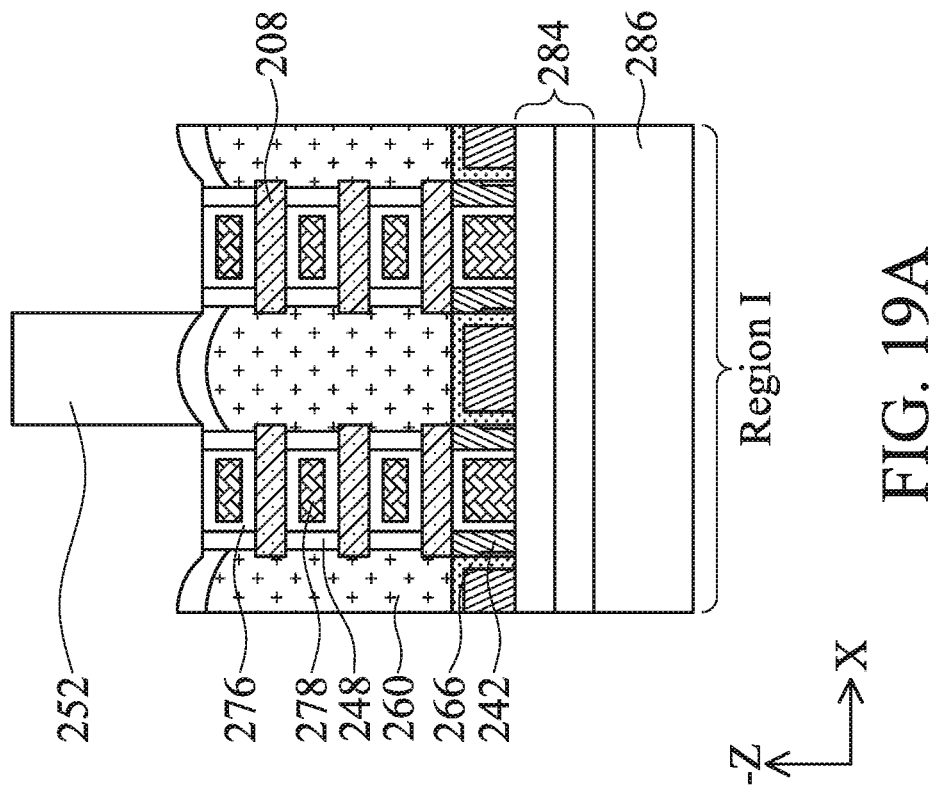

At operation 136, the method 100 (FIG. 1C) removes the top substrate portion 202a in the region I from the backside of the device 200. The resultant structure is shown in FIGS. 19A and 19B according to an embodiment. The operation 136 may include first forming an etch mask (not shown) covering the region II. The operation 136 then applies an etching process that is tuned to be selective to the materials of the semiconductor material (e.g. silicon) in the upper substrate portion 202a and with no (or minimal) etching to the bottom S/D layer 252. The etching process can be dry etching, wet etching, reactive ion etching, or other etching methods. After the removing of the top substrate portion from the region I, the metal gate stacks 274, the inner spacers 248, and the S/D features 260 are exposed at the backside of the device 200. The etch mask is subsequently removed, for example, by a resist stripping process or other suitable process. The top substrate portion 202a remains in the region II of the device 200.

At operation 138, the method 100 (FIG. 1C) deposits a dielectric layer 288 on the backside of the device 200. The resultant structure is shown in FIGS. 20A and 20B according to an embodiment. The operation 138 may first include a chemical thinning process to recess the top substrate portion 202a in the region II to a level lower than the bottom S/D layer 252 in the region I. The operation 138 then deposits the dielectric layer 288 covering both the regions I and II. The dielectric layer 288 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The dielectric layer 288 may be formed by PE-CVD (plasma enhanced CVD), F-CVD (flowable CVD), or other suitable methods. The operation 138 may also include a CMP process to planarize the dielectric layer 288 to remove excessive dielectric materials from the backside of the device 200. Since the dielectric layer 288 and the bottom S/D layer 252 include different materials so that the bottom S/D layer 252 may act as a CMP stop when the dielectric layer 288 is planarized by the CMP process. After the operation 138, the bottom S/D layer 252 is exposed in the region I, while the top substrate portion 202a remains covered by the dielectric layer 288 in the region II.

Figure 21B:
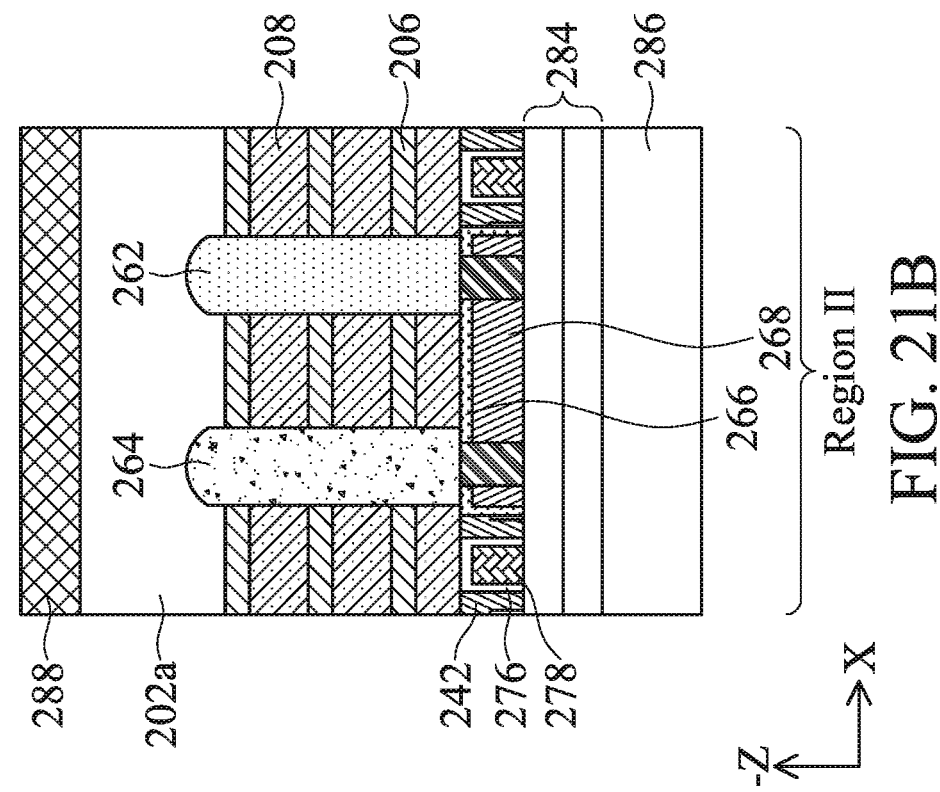
Figure 21A:
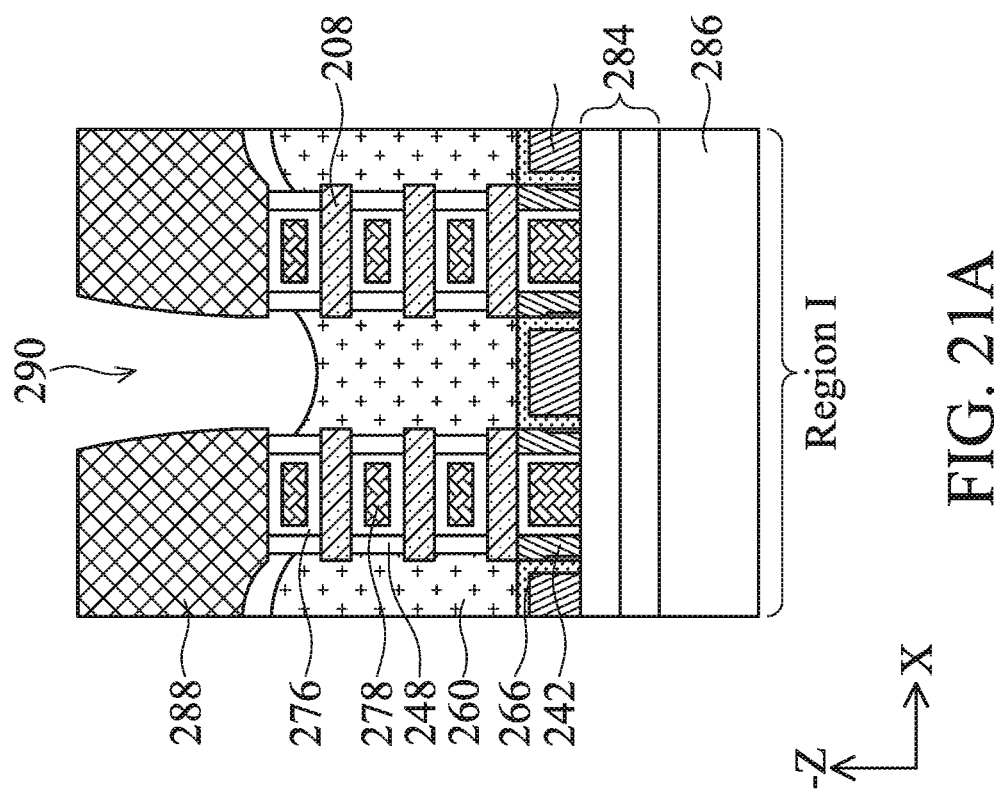

At operation 140, the method 100 (FIG. 1C) selectively etches the bottom S/D layer 252 to form a backside trench 290 surrounded by the dielectric layer 288. The backside trench 290 expose a surface of the source feature 260 from the backside. The resultant structure is shown in FIGS. 21A and 21B according to an embodiment. In the present embodiment, the operation 140 applies an etching process that is tuned to be selective to the materials of the material (e.g. SiGe) in the bottom S/D layer 252 and with no (or minimal) etching to the dielectric layer 288. In the present embodiment, the etching process also etches the source feature 260 to recess it to a level that is below drain features 260 that are still covered by the dielectric layer 288. In furtherance of the embodiment, the source feature 260 is recessed to be below the dielectric layer 288 and the bottommost inner spacer 248. The operation 140 may apply more than one etching processes. For example, it may apply a first etching process to selectively remove the bottom S/D layer 252, and then apply a second etching process to selectively recess the source feature 260 to the desired level, where the first and the second etching processes use different etching parameters such as using different etchants. The etching process(es) can be dry etching, wet etching, reactive ion etching, or other etching methods.

Figure 22B:
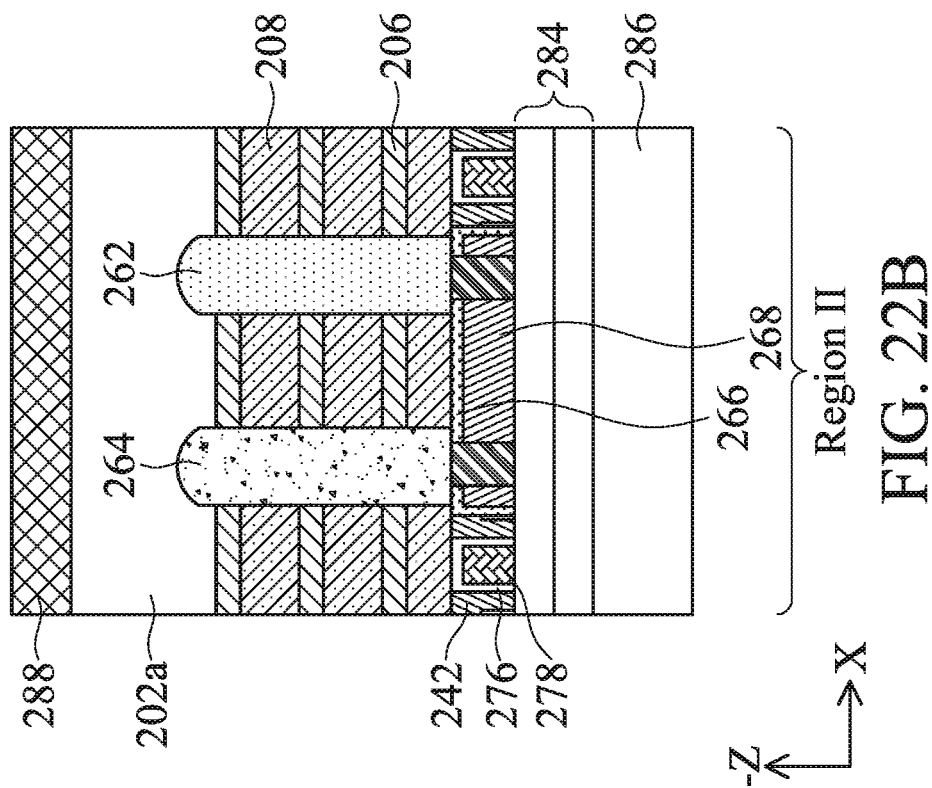
Figure 22A:
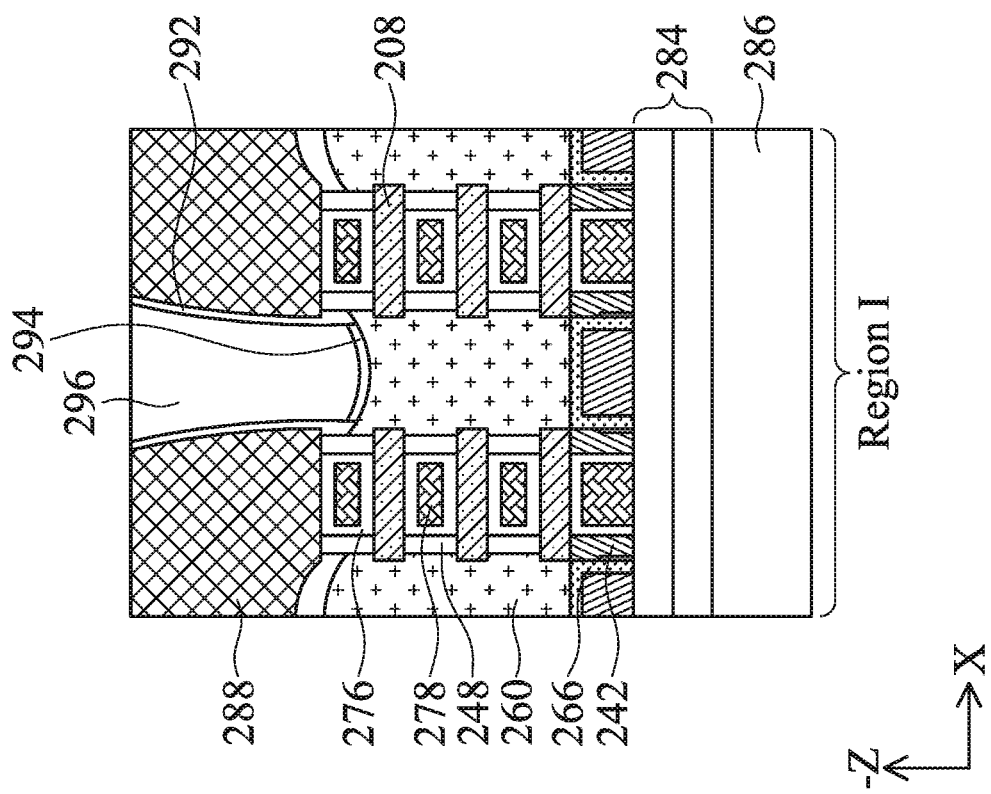

At operation 142, the method 100 (FIG. 1C) deposits a dielectric liner 292 on sidewalls of the backside trench 290, as shown in FIGS. 22A and 22B according to an embodiment. In some embodiments, the dielectric liner 292 is conformally deposited to have a substantially uniform thickness along the various surfaces of the dielectric layer 288, the inner spacers 248, and the recessed source feature 260. In various embodiment, the dielectric liner 292 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). The dielectric liner 292 may be deposited using ALD, CVD, or other suitable methods, and may have a thickness of about 0.5 nm to about nm in various embodiments. The operation 142 further includes a breakthrough etching process for breaking through, and removing the majority of, the horizontal portions of the dielectric liner 292. In some embodiments, the breakthrough etching process may include an anisotropic dry etch process, or the like. In some embodiments where the dielectric liner 292 is formed of an oxide compound, the BT etching process is a reactive ion etch (RIE) process with etch process gases including $CHF_3$, Ar, $CF_4$, $N_2$, $O_2$, $CH_2F_2$, $SF_3$, the like, or a combination thereof. In the illustrated embodiment, as a result of the operation 142, portions of the dielectric liner 292 remain on sidewalls of the backside trench 290, including surfaces of the dielectric layer 288 and the inner spacers 248. The recessed source feature 260 is exposed again in the backside trench 290 after the breakthrough etching process.

At operation 144, the method 100 (FIG. 1C) forms a silicide feature 294 in the backside trench 290 over the source feature 260, as shown in FIGS. 22A and 22B according to an embodiment. In an embodiment, the operation 144 first deposits one or more metals into the backside trench 290, performing an annealing process to the device 200 to cause reaction between the one or more metals and the source feature 260 to produce the silicide feature 294, and removing un-reacted portions of the one or more metals, leaving the silicide feature 294 in the backside trench 290. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 294 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds.

At operation 146, the method 100 (FIG. 1C) forms backside S/D contact 296 in the backside trench 290 over the silicide feature 294 in the region I. The resultant structure is shown in FIGS. 22A and 22B according to an embodiment. In an embodiment, the backside S/D contact 296 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the backside S/D contact 296. The dielectric liner 292 serves as a dielectric barrier layer preventing the metallic material in the backside S/D contact 296 from diffusing into the dielectric layer 288.

Figure 23B:
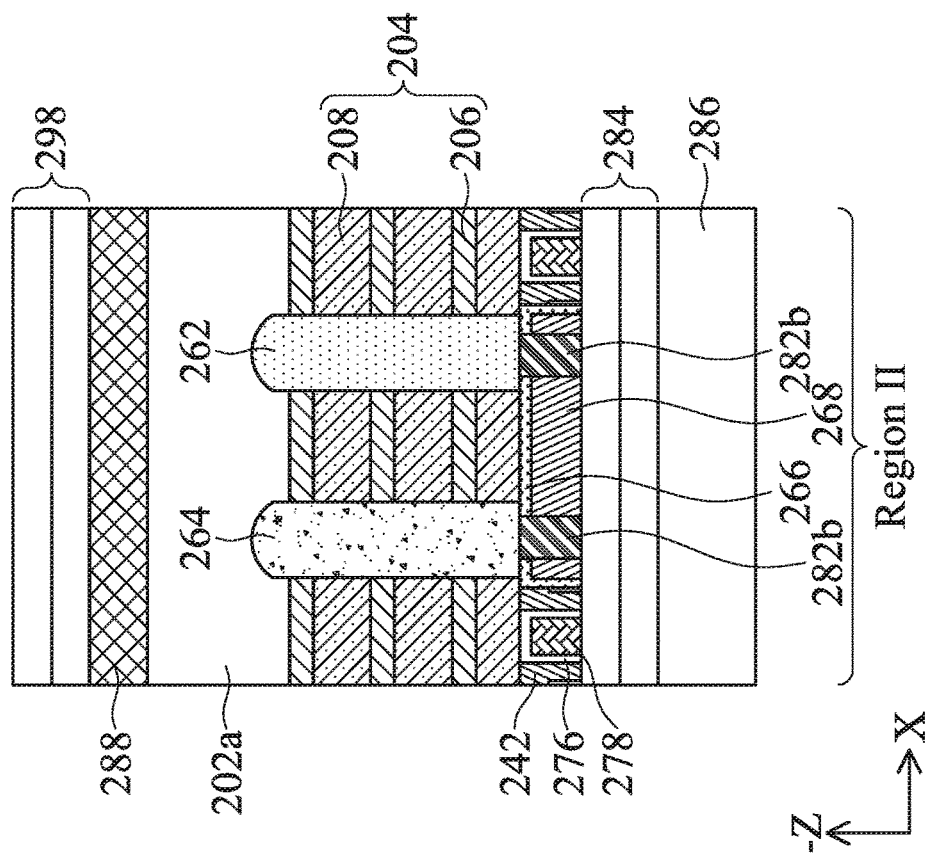
Figure 23A:
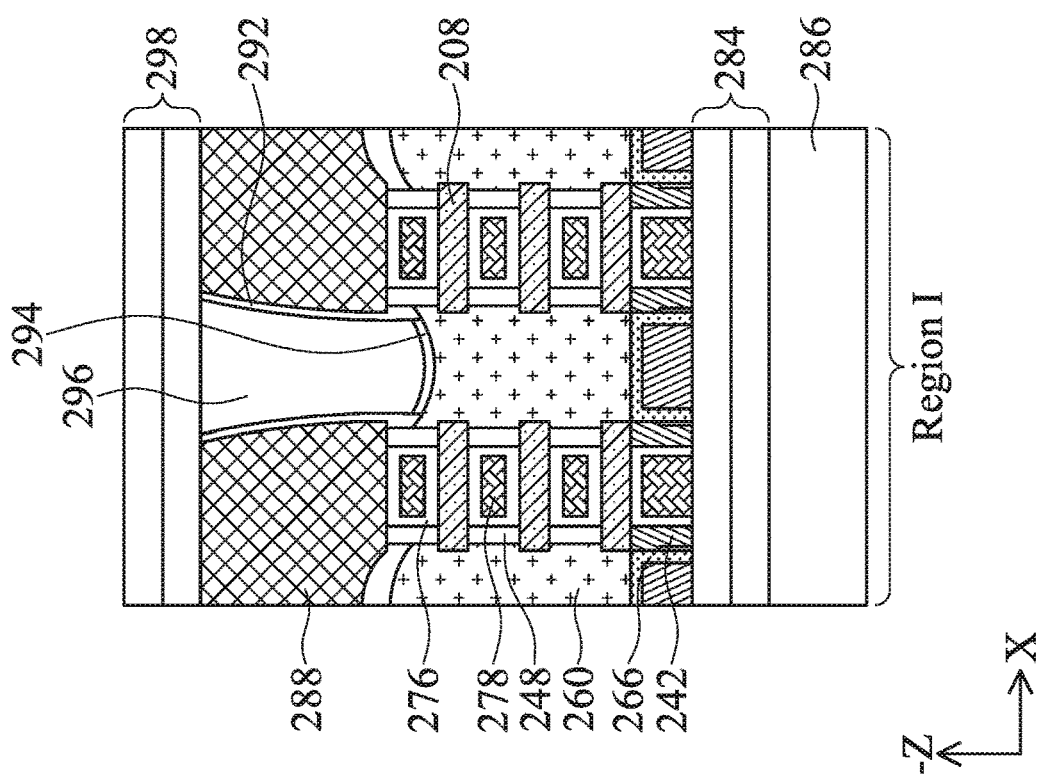

At operation 148, the method 100 (FIG. 1C) performs further fabrication processes to the device 200. For example, it may form a metal wiring layer 298, such as backside power rails, on the backside of the device 200. The resultant structure is shown in FIGS. 23A and 23B according to an embodiment. The metal wiring layer 298 electrically connects to the backside S/D contact 296 in the region I. In an embodiment, the metal wiring layer may be formed using a damascene process, a dual-damascene process, a metal patterning process, or other suitable processes. The metal wiring layer may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Having a backside metal wiring layer beneficially increases the number of metal tracks available in the device 200 for directly connecting to source/drain contacts and vias. It also increases the gate density for greater device integration than other structures without the backside metal wiring layer. In some embodiments, one of the two contacts 282b of the ESD diode (e.g., either the one disposed on the P+ region 264 or the one disposed on the N+ region 262) is electrically coupled to the metal wiring layer 284 on the frontside of the device 200, while the other contact 282b is electrically coupled to the metal wiring layer 298 on the backside of the device 200 such as by a through-substrate-via (TSV). The method 100 at operation 148 may also form one or more interconnect layers on the backside of the device 200, form passivation layers on the backside of the device 200, perform other BEOL processes, and remove the carrier 286. As shown in FIGS. 23A and 23B, even though bulk semiconductor substrate is removed from the region I in the illustrated multi-gate process flow as part of the backside metal wiring layer formation, the top substrate portion 202a is preserved in the region II under the epitaxial layers 206/208 and the N+/P+ regions 262/264, which provides extra ESD current path in the substrate and thus less ESD resistance.

Although not intended to be limiting, embodiments of the present disclosure provide one or more of the following advantages. For example, embodiments of the present disclosure form ESD protection device and methods of fabrication thereof that is compatible with multi-gate transistor process flows. In various embodiment, the methods in the present disclosure preserves a bulk semiconductor substrate for the ESD protection device after a backside substrate thinning process, which provides more current path for electrostatic discharging events. Further, some embodiments of the present disclosure form implant regions on the same fin element comprising a stack of epitaxial layers, which enhances ESD current conductivity and reduces ESD parasitic capacitance. Embodiments of the process flow also supports the formation of multi-gate transistors with backside metal wiring layer, such as backside power rails, to increase the number of metal tracks available in an integrated circuit and increase the gate density for greater device integration. Embodiments of the present disclosure can be readily integrated into existing semiconductor manufacturing processes.

In one example aspect, the present disclosure is directed to a method of manufacturing a semiconductor device. The method includes providing a structure having a frontside and a backside, the structure including a substrate and a stack of a first type and a second type epitaxial layers having different material compositions alternatively stacked above the substrate, wherein the stack is at the frontside of the structure and the substrate is at the backside of the structure; patterning the stack, thereby forming a fin above the substrate; implanting a first dopant into a first region of the fin, the first dopant having a first conductivity type; implanting a second dopant into a second region of the fin, the second dopant having a second conductivity type opposite the first conductivity type; and forming a first contact on the first region and a second contact on the second region. In some embodiments, the first and second regions are separated by a middle portion of the fin. In some embodiments, the method also includes forming first and second dummy gate stacks on the fin; depositing an inter-layer dielectric (ILD) layer on sidewalls of the first and second dummy gate stacks and covering the fin; and replacing the first and second dummy gate stacks with first and second metal gate stacks. In some embodiments, the first and second contacts are between the first and second metal gate stacks. In some embodiments, each of the first and second metal gate stacks has a width less than that of the fin. In some embodiments, the method also includes thinning down the substrate from the backside of the structure; and depositing a dielectric layer at the backside of the structure. In some embodiments, the method further includes forming an isolation structure surrounding the fin; and forming at least a gate stack directly above the isolation structure. In some embodiments, where the fin is a first fin and the patterning of the stack also forms a second fin, the method further includes removing the second type epitaxial layers from the second fin, thereby exposing the first type epitaxial layers; and forming a metal gate stack engaging the first type epitaxial layers in the second fin. In some embodiments, the second fin has a width less than that of the first fin.

In another example aspect, the present disclosure is directed to a method of manufacturing a semiconductor device. The method includes forming a fin extruding from a substrate, wherein the fin includes a first type and a second type epitaxial layers on a semiconductor substrate, the first type and the second type epitaxial layers having different material compositions and alternatingly disposed in a vertical direction; forming first and second gate structures above the fin; doping a first region of the fin with a first dopant of a first conductivity type; doping a second region of the fin with a second dopant of a second conductivity type opposite the first conductivity type, wherein the first and second regions are between the first and second gate structures; forming a dielectric layer on sidewalls of the first and second gate structures; forming contact holes in the dielectric layer exposing the first and second regions; and forming conductive contacts in the contact holes. In some embodiments, the doping of the first and second regions has a doping depth extending into the semiconductor substrate. In some embodiments, the method further includes thinning down the semiconductor substrate; and depositing an oxide layer under the semiconductor substrate. In some embodiments, the fin has a width larger than that of either the first or second gate structure. In some embodiments, after the doping of the first and second regions of the fin, a middle portion of the fin is substantially free of the first and second dopants.

In yet another example aspect, the present disclosure is directed to an electrostatic discharging (ESD) device. The ESD device includes a semiconductor substrate; a stack of a first type and a second type epitaxial layers on the semiconductor substrate, the first type and the second type epitaxial layers having different material compositions and the first type and the second type epitaxial layers being alternatingly disposed in a vertical direction; a first implant region in the stack, wherein the first implant region has a first conductivity type; and a second implant region in the stack, wherein the second implant region has a second conductivity type opposite the first conductivity type. In some embodiments, the ESD device further includes a middle region in the stack between and adjoining the first and second implant regions. In some embodiments, the ESD device further includes an oxide layer under the semiconductor substrate. In some embodiments, the ESD device further includes first and second gate stacks above the stack, wherein the first and second implant regions are between the first and second gate stacks. In some embodiments, the first and second gate stacks are directly above the stack. In some embodiments, the ESD device further includes an isolation structure above the semiconductor substrate and surrounding the stack, where the first and second gate stacks are directly above the isolation structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin disposed in a first region of the semiconductor device, the fin having first type epitaxial layers and second type epitaxial layers alternatingly disposed in a vertical direction, the first type epitaxial layers having a first material composition and the second type epitaxial layers having a second material composition different from the first material composition;
a plurality of channel members disposed in a second region of the semiconductor device and stacked in the vertical direction, the channel members having the first material composition;
first and second metal gates disposed on a top surface of the fin;
a third metal gate wrapping around each of the channel members;
a first implant region in the fin, wherein the first implant region has a first conductivity type; and
a second implant region in the fin, wherein the second implant region has a second conductivity type opposite the first conductivity type.

2. The semiconductor device of claim 1, wherein the first and second implant regions are laterally between the first and second metal gates.

3. The semiconductor device of claim 1, wherein each of the first and second metal gates is completely within a boundary of the top surface of the fin.

4. The semiconductor device of claim 1, wherein the fin has a first width measured in a lengthwise direction of the first and second metal gates, the channel members have a second width measured in a lengthwise direction of the third metal gate, and the first width is larger than the second width.

5. The semiconductor device of claim 1, further comprising:
a semiconductor substrate directly under the fin,
wherein at least one of the first and second implant regions extends downwardly through a bottommost one of the first and second type epitaxial layers and into a top portion of the semiconductor substrate.

6. The semiconductor device of claim 5, wherein the semiconductor substrate does not laterally extend into the second region.

7. The semiconductor device of claim 1, further comprising:
a first contact landing on the first implant region; and
a second contact landing on the second implant region.

8. The semiconductor device of claim 7, wherein the first and second contacts are laterally between the first and second metal gates.

9. The semiconductor device of claim 7, further comprising:
a dielectric layer disposed on the fin and extending from a sidewall of the first metal gate to a sidewall of the second metal gate,
wherein each of the first and second contact extends through the dielectric layer.

10. The semiconductor device of claim 1, wherein the first implant region is laterally distant from the second implant region.

11. A semiconductor device, comprising:
a semiconductor substrate;
an epitaxial stack disposed above the semiconductor substrate, the epitaxial stack including first and second type epitaxial layers, the first and second type epitaxial layers having different material compositions, and the first and second type epitaxial layers being alternatingly disposed in a vertical direction;
a first implant region in the epitaxial stack, the first implant region having a first dopant of a first conductivity type;
a second implant region in the epitaxial stack, the second implant region having a second dopant of a second conductivity type opposite the first conductivity type; and
first and second gate stacks disposed above the epitaxial stack,
wherein the first and second implant regions are between the first and second gate stacks, and in a top view of the semiconductor device the first and second gate stacks are within a boundary of a top surface of the epitaxial stack.

12. The semiconductor device of claim 11, wherein each of the first and second implant regions extends downwardly through the epitaxial stack and into a top portion of the semiconductor substrate.

13. The semiconductor device of claim 11, further comprising:
a first dielectric layer laterally between the first and second gate stacks; and
a second dielectric layer directly under the semiconductor substrate.

14. The semiconductor device of claim 13, further comprising:
a first metal wiring layer above the first dielectric layer; and
a second metal wiring layer under the second dielectric layer.

15. The semiconductor device of claim 11, further comprising:
first and second contact features disposed on the first and second implant regions, respectively,
wherein the first and second contact features are laterally between the first and second gate stacks.

16. The semiconductor device of claim 11, wherein each of the first and second implant regions has a width equal to a width of the epitaxial stack.

17. The semiconductor device of claim 11, wherein the epitaxial stack includes a portion substantially free of the first and second dopants, and the portion is laterally between the first and second implant regions.

18. A method of manufacturing a semiconductor device, comprising:
providing a structure having a substrate and a stack of first and second type epitaxial layers having different material compositions alternatively stacked above the substrate;
patterning the stack, thereby forming a fin above the substrate;
implanting a first dopant into a first region of the fin, the first dopant having a first conductivity type;
implanting a second dopant into a second region of the fin, the second dopant having a second conductivity type opposite the first conductivity type, wherein the second region is laterally distant from the first region; and
forming first and second metal gate structures disposed on a top surface of the fin,
wherein the first and second regions are between the first and second metal gate structures, and wherein in a top view of the semiconductor device the first and second metal gate structures are within a boundary of the top surface of the fin.

19. The method of claim 18, further comprising:
forming a first contact on the first region and a second contact on the second region.

20. The method of claim 18, further comprising:
thinning the substrate from a backside of the substrate; and
depositing a dielectric layer on the backside of the substrate.

* * * * *